US011114738B2

(12) United States Patent
Allen et al.

(10) Patent No.: US 11,114,738 B2
(45) Date of Patent: Sep. 7, 2021

(54) TUNABLE RESONANT CIRCUIT COMPRISING A RF RESONATOR GEOMETRY DISPOSED ON AN ACTIVE MATERIAL LAYER SUCH THAT RESONANCE CHANGES WHEN PHOTON ENERGY IS APPLIED

(71) Applicant: Government of the United States, as represented by the Secretary of the Air Force, Wright-Patterson AFB, OH (US)

(72) Inventors: Jeffery Allen, Niceville, FL (US); Monica Allen, Niceville, FL (US); Daniel Wasserman, Champaign, IL (US); Brett Wenner, Springboro, OH (US)

(73) Assignee: United States of America as represented by the Secretary of the Air Force, WPAFB, OH (US)

( * ) Notice: Subject to any disclaimer, the term of this patent is extended or adjusted under 35 U.S.C. 154(b) by 62 days.

(21) Appl. No.: 16/101,772

(22) Filed: Aug. 13, 2018

(65) Prior Publication Data

US 2019/0006730 A1 Jan. 3, 2019

Related U.S. Application Data

(63) Continuation of application No. 15/707,188, filed on Sep. 18, 2017, now abandoned.
(Continued)

(51) Int. Cl.
*H01P 7/08* (2006.01)
*G01J 1/44* (2006.01)
(Continued)

(52) U.S. Cl.
CPC ............... *H01P 7/088* (2013.01); *G01J 1/42* (2013.01); *G01J 1/44* (2013.01); *G01J 5/10* (2013.01);
(Continued)

(58) Field of Classification Search
CPC .......... H01P 7/088; G02F 1/015; G02B 5/288
(Continued)

(56) References Cited

U.S. PATENT DOCUMENTS

| 5,459,800 A | 10/1995 | Enokihara et al. |
| 5,965,494 A * | 10/1999 | Terashima et al. ........... H01P 1/20363 |
| | | 333/219 |

(Continued)

OTHER PUBLICATIONS

F. Aznar, et al. "Characterization of miniaturized metamaterial resonators coupled to planar transmission lines through parameter extraction," Journal of Applied Physics, vol. 104, p. 114501, 2008.
(Continued)

*Primary Examiner* — Benny T Lee
(74) *Attorney, Agent, or Firm* — AFMCLO/JAZ; Charles Figer, Jr.

(57) ABSTRACT

Embodiments of the invention provide a resonant circuit including an active material substrate excitable by photon energy. A busline having a single input and a single output is located on the active material substrate. A RF resonator geometry is located on the active material substrate in electrical communication with the busline. Application of photon energy to the active material substrate changes the resonance of the RF resonator geometry at room temperatures. Alternately, a resonant circuit is provided that include a passive material substrate. An active material thin film is located on the passive material substrate. A busline having a single input and a single output and a RF resonator geometry located on the active material thin film. The RF
(Continued)

resonator geometry is in electrical communication with the busline. Application of photon energy to the active material thin film changes the resonance of the RF resonator geometry at room temperatures.

11 Claims, 21 Drawing Sheets

Related U.S. Application Data

(60) Provisional application No. 62/396,580, filed on Sep. 19, 2016.

(51) Int. Cl.
| | |
|---|---|
| *G01J 5/10* | (2006.01) |
| *G01J 1/42* | (2006.01) |
| *G02F 1/015* | (2006.01) |
| *G02B 5/28* | (2006.01) |
| *G01J 5/44* | (2006.01) |

(52) U.S. Cl.
CPC ............. *G02B 5/288* (2013.01); *G02F 1/015* (2013.01); *G01J 5/44* (2013.01); *G01J 2001/4413* (2013.01)

(58) Field of Classification Search
USPC ........................................................ 333/235
See application file for complete search history.

(56) References Cited

U.S. PATENT DOCUMENTS

| | | | | |
|---|---|---|---|---|
| 7,683,444 | B2 * | 3/2010 | Tonucci | G02F 1/015 |
| | | | | 250/336.1 |
| 8,908,251 | B2 * | 12/2014 | Sayyah et al. | G02F 1/292 |
| | | | | 359/254 |
| 9,306,265 | B1 * | 4/2016 | Hossein-Zadeh | H01P 7/00 |
| 2009/0096545 | A1 | 4/2009 | O'Hara et al. | |
| 2012/0236895 | A1 | 9/2012 | Miles | |

OTHER PUBLICATIONS

R. Barends, et al., "Quasiparticle Relaxation in Optically Excited High-$Q$ Superconducting Resonators," Physical Review Letters, vol. 100, p. 257002, Jun. 25, 2008.
R. Bojanic, et al., "Reconfigurable Delay Lines with Split-Ring Resonators," IEEE MTT-S, vol. 17, pp. 7-12, Dec. 2011.
P. K. Day, et a., "A broadband superconducting detector suitable for use in large arrays," Nature, vol. 425, pp. 817-821, Oct. 23/print2003.
S. Doyle, et al., "Lumped Element Kinetic Inductance Detectors," Journal of Low Temperature Physics, vol. 151, pp. 530-536, Apr. 1, 2008 2008.
T. Driscoll, et al., "Tuned permeability in terahertz split-ring resonators for devices and sensors," Applied Physics Letters, vol. 91, p. 062511, 2007.
A. M. Ferendeci, "Coupling parameters for a side-coupled ring resonator and a microstrip line," Microwave Theory and Techniques, IEEE Transactions on, vol. 44, pp. 953-956, 1996.
J. Gao, et al., "A titanium-nitride near-infrared kinetic inductance photon-counting detector and its anomalous electrodynamics," Applied Physics Letters, vol. 101, p. 142602, 2012.
I. Gil, et al., "Varactor-loaded split ring resonators for tunable notch filters at microwave frequencies," Electronics Letters, vol. 40, pp. 1347-1348, 2004.
H. G. Leduc, et al., "Titanium nitride films for ultrasensitive microresonator detectors," Applied Physics Letters, vol. 97, p. 102509, 2010.
B. A. Mazin, et al., "Position sensitive x-ray spectrophotometer using microwave kinetic inductance detectors," Applied Physics Letters, vol. 89, p. 222507, 2006.
B. V. Olson, et al., "Intensity- and Temperature-Dependent Carrier Recombination in $\mathrm{InAs}/\mathrm{In}\{\mathrm{As}\}_{1\ensuremath{-}x}\{\mathrm{S}\mathrm{b}\}_{x}$ Type-II Superlattices," Physical Review Applied, vol. 3, p. 044010, Apr. 17, 2015.
J. M. Sage, et al., "Study of loss in superconducting coplanar waveguide resonators," Journal of Applied Physics, vol. 109, p. 063915, 2011.
G. Slekas, et al., "Tuning of Resonance Frequincy in Array of Slit-Ring Resonators in Terehertz Range," D. Seliuta, vol. 54, pp. 15-19, 2008.
M. R. Vissers, et al., "Low loss superconducting titanium nitride coplanar waveguide resonators," Applied Physics Letters, vol. 97, p. 232509, 2010.
J. Zmuidzinas, "Superconducting Microresonators: Physics and Applications," Annual Review of Condensed Matter Physics, vol. 3, pp. 169-214, 2012.

* cited by examiner

FIG. 10C
FIG. 10D
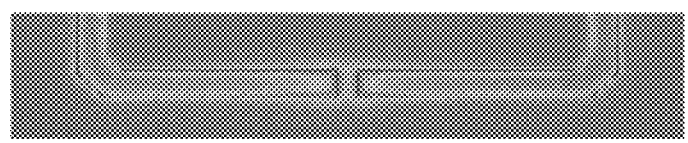
FIG. 10E
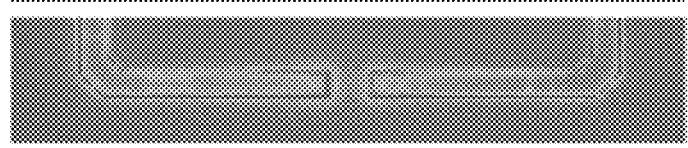
FIG. 10F
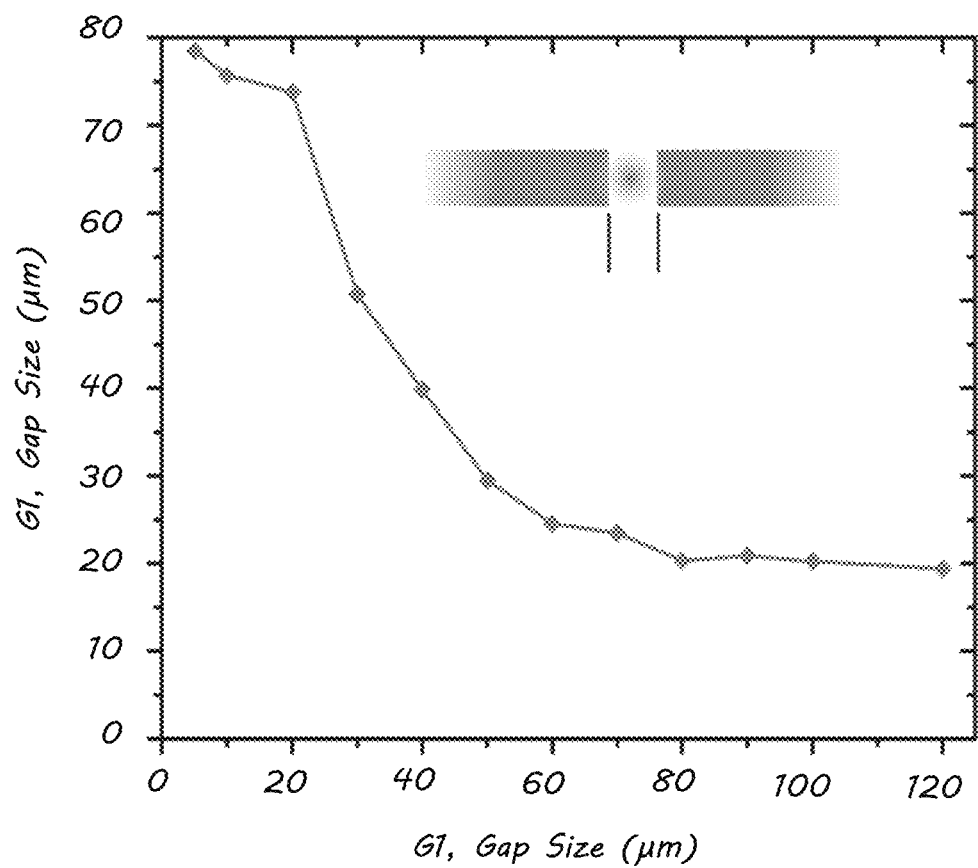
FIG. 11

TUNABLE RESONANT CIRCUIT COMPRISING A RF RESONATOR GEOMETRY DISPOSED ON AN ACTIVE MATERIAL LAYER SUCH THAT RESONANCE CHANGES WHEN PHOTON ENERGY IS APPLIED

CROSS-REFERENCE TO RELATED APPLICATIONS

This application is a continuation of U.S. application Ser. No. 15/707,188, entitled "Tunable Resonant Devices on Active Substrates," filed on Sep. 18, 2017 now abandoned, which claims the benefit of and priority to U.S. Provisional Application Ser. No. 62/396,580, entitled "Tunable Resonant Devices on Active Substrates," filed on Sep. 19, 2016, the entireties of which are incorporated by reference herein.

RIGHTS OF THE GOVERNMENT

The invention described herein may be manufactured and used by or for the Government of the United States for all governmental purposes without the payment of any royalty.

BACKGROUND OF THE INVENTION

Field of the Invention

The present invention generally relates to resonant devices and, more particularly, to tunable resonant devices.

Description of the Related Art

Semiconductor based devices operating at microwave frequencies are of increasing importance for the technologically vital fields of high-speed electronics, on-chip, fiber-based, and free-space communication, and next-generation optoelectronics. These devices, because they operate in the radio frequency (RF) portion of the electromagnetic spectrum, generally require RF-based passive circuitry to drive and/or read out device response. The rapid growth of wireless communication technologies has resulted in an abundance of new chip-scale radio-frequency (RF) structures and devices, with a corresponding decrease in RF device cost. New technologies and the scaling of RF components hold the potential to continue the shrinking of the "THz gap" between optical and optoelectronic devices (typically operating at greater than 100 THz frequencies) and electronic devices, with available devices operating now up to hundreds of GHz and even THz frequencies. There is thus increasing interest in devices and architectures that are able to merge RF and optical capabilities, linking these two technologies that make the foundation of our modern communication infrastructure.

Rapid recent developments of RF technologies, which have been spurred primarily by the continued growth of the wireless communication field, have resulted in a cost-effective and compact infrastructure for new photonic devices leveraging RF frequency signals, and allowing for chip-scale versions of free-space RF technologies. Unlike the majority of devices which comprise the field of RF photonics (whose focus is largely on the modulation and demodulation of optical carrier signals at RF frequencies), these devices exist in a small but growing subfield encompassing devices where RF signals are modulated by optical signals. Such an approach opens the door to entirely new functionality, where RF signals can either be modulated/controlled at very high rates (akin to optical circuits), or alternatively, with great sensitivity to incident optical signals. The most recent examples of such devices are the microwave- or lumped element-kinetic inductance detectors (M-KID and LE-KID, respectively). These detectors consist of resonant RF micros trip or coplanar waveguide resonant LC circuits fabricated from superconducting materials, resulting in extremely high Q ($>10^6$) RF resonances. The high-Q resonators are coupled to a single busline (also of superconducting material) carrying a signal at the resonant frequency of the LC resonator. Light incident on the resonator structure is absorbed by the superconducting material which generates quasiparticles and alters the surface impedance of the metal film. This results in a dramatic change in the resonator Q which can be read out as a change in amplitude or phase of the RF signal on the busline. The high-Q of the resonator allows for extremely sensitive detection, as well as the multiplexing of numerous detectors along a single busline, as each detector can be designed to have a unique resonant frequency (in addition to its extremely high Q). Thus, simultaneous readout of thousands of detectors can be achieved on a single busline by careful spectral filtering of the transmitted signal.

The -KID class of detector has applications in astronomy and astrophysics due to the broad spectral range of the detectors (from X-rays to mm- and sub-mm wavelengths) and sensitivities high enough to resolve single photon absorption events. However, these detectors require low temperature operation (dictated by the critical temperature ($T_C$) of the superconducting material) and exhibit long recovery time constants which limits the detector bandwidth to the low kHz range.

Accordingly, there is a need in the art for the greater accessibility to such detectors, but without the limiting temperature constraints, which affect detector bandwidth.

SUMMARY OF THE INVENTION

Embodiments of the invention address the need in the art for low-cost photodetectors, especially in the IR region, and also for emitters/antennas, antenna arrays, and signal processing of microwave, mm and THz signals. Embodiments of the invention also address a cost-effective measurement of high-frequency device performance and material response across a range of optical materials.

Embodiments of the invention use coupled line microwave resonators, such as a split ring resonator (SRR), patterned onto substrates that are comprised of active material system such as GaAs, or alternatively in other embodiments, on passive materials with active material thin films either deposited or disposed using "pick-and-place" methods along the microwave circuit. When the device is exposed to radiation that corresponds to the bandgap of the active material, free charge carriers are excited and the resonance of the resonator changes therefore either attenuating, or more often, amplifying, the output signal on the line. This could be scattered energy or coherent focused energy from a source such as a LASER where the focused energy is directed to areas of the resonator such as the coupling region or SRR gap to get different effects.

These devices may be fabricated using standard planar fabrications techniques. This allows for arrays of the devices with varying properties, resonators and functions to be incorporated into a system, using only one input/output line, effectively multiplexing many detectors on a single read-out.

Embodiments of the invention are inexpensive, easy to fabricate using standard commercial processes and easily configurable to make such devises as a room-temperature semiconductor-based photodetector where readout is achieved using a resonant RF circuit consisting of a micros trip split-ring resonator coupled to a micros trip busline, fabricated on a semiconductor substrate. The RF resonant circuit is characterized for its response to incident IR radiation. Benefits also lie in the device architecture, which offers the potential for multiplexing arrays of devices on a single read-out line, in addition to high speed response for either direct coupling of optical signals to RF circuitry, or alternatively, carrier dynamics characterization of semiconductor materials. Embodiments of the invention also have the ability to close the THz gap because of the combined use of semiconductor and RF devices. This architecture also opens the door to door to practical Photonic RF devices where traditionally expensive and complex optical to electrical (O/E) devices such as modulators have been used.

The design methodology developed and underpinning principles may benefit numerous applications, including materials characterization, direct integration of optical signals with microwave circuitry, and multiplexed, high speed read-outs of multiple detector arrays into RF electronic circuitry. More specifically in RF Photonics and architectures 1) photonic generation of RF signals, 2) photonic processing of RF signals, 3) photonic distribution of RF signals, and 4) photonic analog-to-digital conversion.

Some embodiments of the invention provide a resonant circuit including an active material substrate excitable by photon energy. A busline having a single input and a single output is located on the active material substrate. A RF resonator geometry is located on the active material substrate in electrical communication with the busline. Application of photon energy to the active material substrate changes the resonance of the RF resonator geometry at room temperatures.

Alternately, other embodiments of the invention provide a resonant circuit is provided that include a passive material substrate. An active material thin film is located on the passive material substrate. A busline having a single input and a single output and a RF resonator geometry located on the active material thin film. The RF resonator geometry is in electrical communication with the busline. Application of photon energy to the active material thin film changes the resonance of the RF resonator geometry at room temperatures.

The responsivity of room-temperature, semiconductor-based photodetectors consisting of resonant RF circuits coupled to micros trip buslines is demonstrated through illustrated embodiments of the invention. Significant improvements in detector response are illustrated by choice of photoconductive material, and for a given material, by positioning our optical signal to overlap with positions of RF field enhancement. Design of RF circuits with strong field enhancement are demonstrated to further improve detector response. The improved detector response demonstrated offers opportunities for applications in RF photonics, materials metrology, or single read-out multiplexed detector arrays.

A technique for mapping the electric field profiles in resonant microwave circuits is also demonstrated. Optical pumping of microwave circuits fabricated on semiconductor substrates is shown to result in a modulation of the load power proportional to the electric field of the microwave signal in the resonant circuit. By reading out the modulation in transmitted signal as a function of the position of the optical excitation, for a range of driving frequencies, it is possible to produce 2D images related to the microwave electric fields in the circuits. Images are generated for a range of resonator designs and compared to numerical simulations. The presented technique is analytically modeled to show potential applicability to a variety of RF circuits.

Additional objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention.

FIG. 10C contains simulation results of RF electric field magnitude on resonance at semiconductor surface for RRFPs with 20 μm capacitive gap;

FIG. 10D contains simulation results of RF electric field magnitude on resonance at semiconductor surface for RRFPs with 40 μm capacitive gap;

FIG. 10E contains simulation results of RF electric field magnitude on resonance at semiconductor surface for RRFPs with 80 μm capacitive gap;

FIG. 10F contains simulation results of RF electric field magnitude on resonance at semiconductor surface for RRFPs with 120 μm capacitive gap;

FIG. 11 is a graph illustrating peak responsivity for RF detector structures as a function of SRR gap size with responsivity measured, for each resonator, at the spatial location where the response is largest;

It should be understood that the appended drawings are not necessarily to scale, presenting a somewhat simplified representation of various features illustrative of the basic principles of the invention. The specific design features of the sequence of operations as disclosed herein, including, for example, specific dimensions, orientations, locations, and shapes of various illustrated components, will be determined in part by the particular intended application and use environment. Certain features of the illustrated embodiments have been enlarged or distorted relative to others to facilitate visualization and clear understanding. In particular, thin features may be thickened, for example, for clarity or illustration.

DETAILED DESCRIPTION OF THE INVENTION

Embodiments of the invention provide inexpensive technology that may assist in enabling electro-magnetic wave emission, detection, manipulation and processing that can be applied across many frequency regimes with minor changes in architecture and at room temperature. In addition these embodiments of the invention may also enable efficient and cost-effective measurement of high-frequency device performance and material response across a range of optical materials and optoelectronic device architectures.

Figures 1A, 1B:
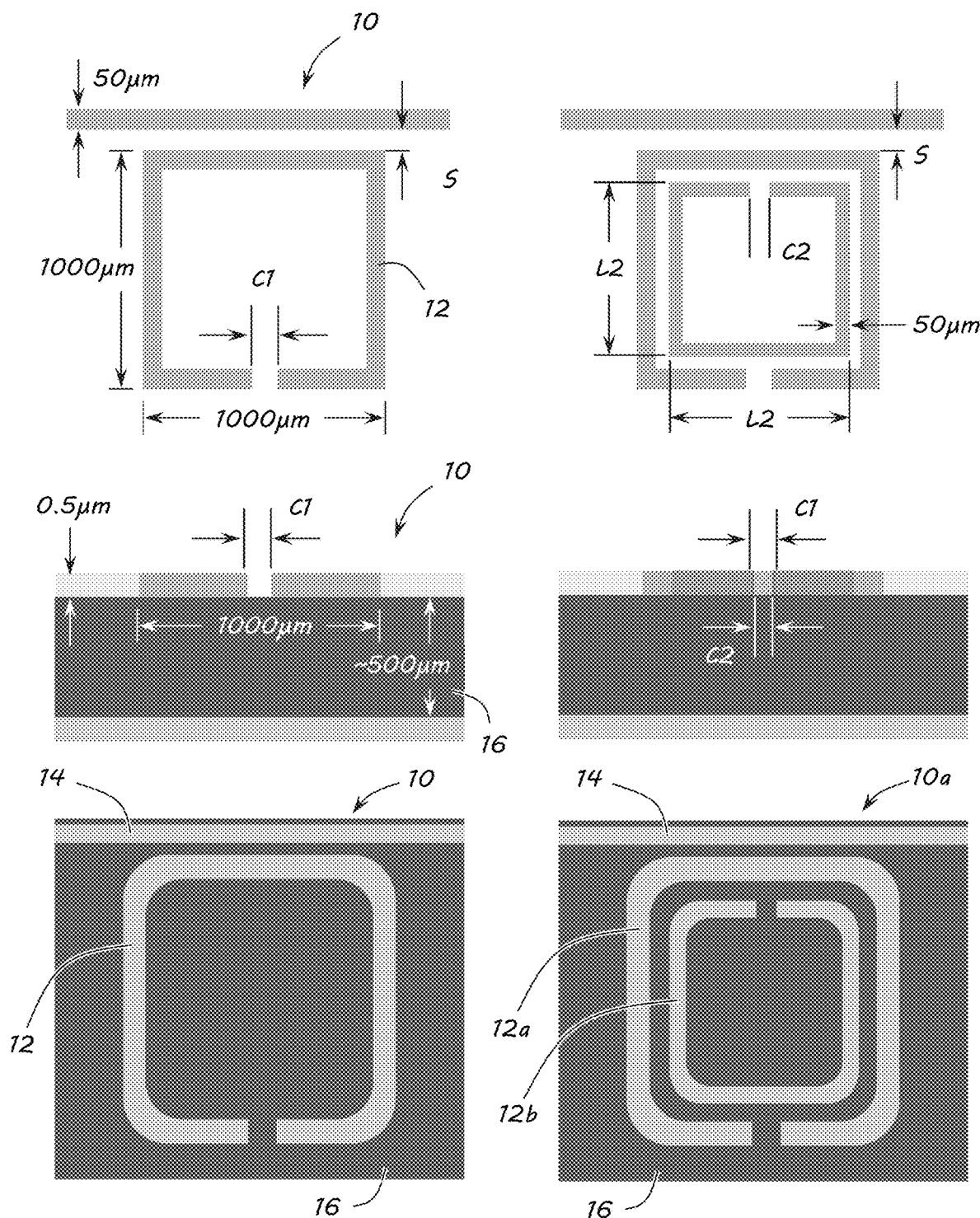
FIGS. 1A-1D illustrate schematics and equivalent circuit models of embodiments of the invention.

Turning now to the drawings, where like numbers represent like features across the several views, one exemplary architecture of an embodiment of the invention includes a room-temperature semiconductor-based photodetector where readout may be achieved using a resonant RF circuit 10 consisting of a microstrip split-ring resonator 12 coupled to a microstrip busline 14, fabricated on a semiconductor substrate 16 as illustrated in FIG. 1A. The split ring resonator is symmetric with length and width dimensions of 1000 μm each and a gap with a nominal diameter of 50 μm. The RF resonant circuit may be characterized for its response to incident IR radiation. The detectors are modeled analytically and using commercial simulation software, with good agreement to experimental results. The detector architecture offers the potential for multiplexing arrays of detectors on a single read-out line, in addition to high speed response for either direct coupling of optical signals to RF circuitry, or alternatively, carrier dynamics characterization of semiconductor materials. FIG. 1B similarly illustrates a double SRR 10a, with split ring resonators 12a (outer) and 12b (inner). Capacitive gap C1 is associated with the outer split ring 12a, similar to the single SSR in FIG. 1A, and capacitive gap C2, with a nominal diameter of 50 μm is associated with the inner split ring 12b. Parameter L2 represents a length dimension of the split ring 12b.

Figure 1C:
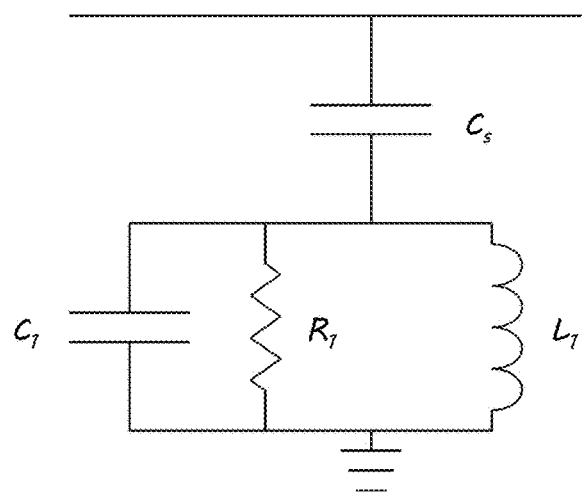
Figure 1D:
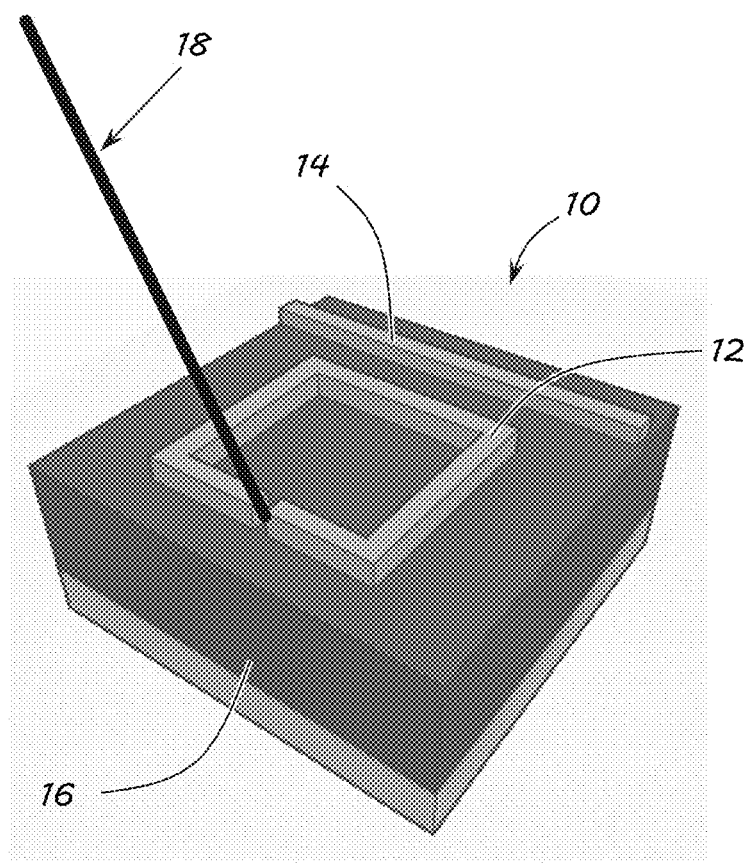

FIGS. 1A and 1B include a schematic (top), cross-sectional schematic (middle) and optical micrograph (bottom) of a single (FIG. 1A) and double (FIG. 1B) SRR detector structures showing relevant dimensions for an exemplary structure (gap C1=C2=50 μm and outer dimensions of 1000 μm), though other structures in other embodiments may have other geometries as well as dimensions, such as a substrate thickness of 500 μm and a split ring resonator thickness of 0.5 μm. FIG. 1C shows an equivalent circuit model (R1—resistance and L1—inductance) for the SRR RF circuit response and FIG. 1D includes a schematic of optically pumped (feature 18 in FIG. 1D) single-SRR detector structure 10. In the exemplary configuration, as shown in FIGS. 1A and 1B, consists of a microstrip busline 14 coupled to a split-ring resonator (SRR) structure 12 (FIG. 1A) with a resonance in the 10-15 GHz range. The devices may be fabricated on a double-side polished semi-insulating (SI) GaAs wafer substrate 16. The circuit may be understood using an equivalent lumped element model as shown in FIG. 1C where the SRR is modeled as an LC resonator that is capacitively coupled (CS) to the busline. When light with energy above the GaAs band-edge is incident upon the gap in the SRR, excited electron hole pairs modulate the conductivity of the SI-GaAs between the capacitive gap thus effectively tuning the RF-response of the resonant circuit. The transmitted RF signal at the output port of the circuit can thus be used to measure the free carrier concentration and intensity of the incident light at the capacitive gap (C1). When operating on resonance, such a detector allows for direct optical modulation of an RF signal. The RF resonance of the SRR can be easily tuned by modifying the geometry and material properties of the unit cell. Multiple SRRs may then be coupled to a single busline offering the potential for RF-multiplexed detection/modulation using a single input and output port as shown in FIG. 1B. The time-response of the detector element may be determined by a combination of carrier lifetimes and/or the inherent time-response of the LC circuit.

The capacitive gap of the SRR may be filled with a range of different materials using direct epitaxial growth on the substrate wafer, some form of pick and place, or deposition techniques to achieve significant control of carrier lifetime and semiconductor band-gap. This offers a path towards multiple-wavelength and high-speed or high-sensitivity detection of incident radiation. Embodiments of the invention demonstrate the performance of such detectors using solely SI GaAs and show control over the RF resonance of the SRR in addition to the ability to detect light on multiple detectors coupled to a single busline.

Figures 2A, 2B:
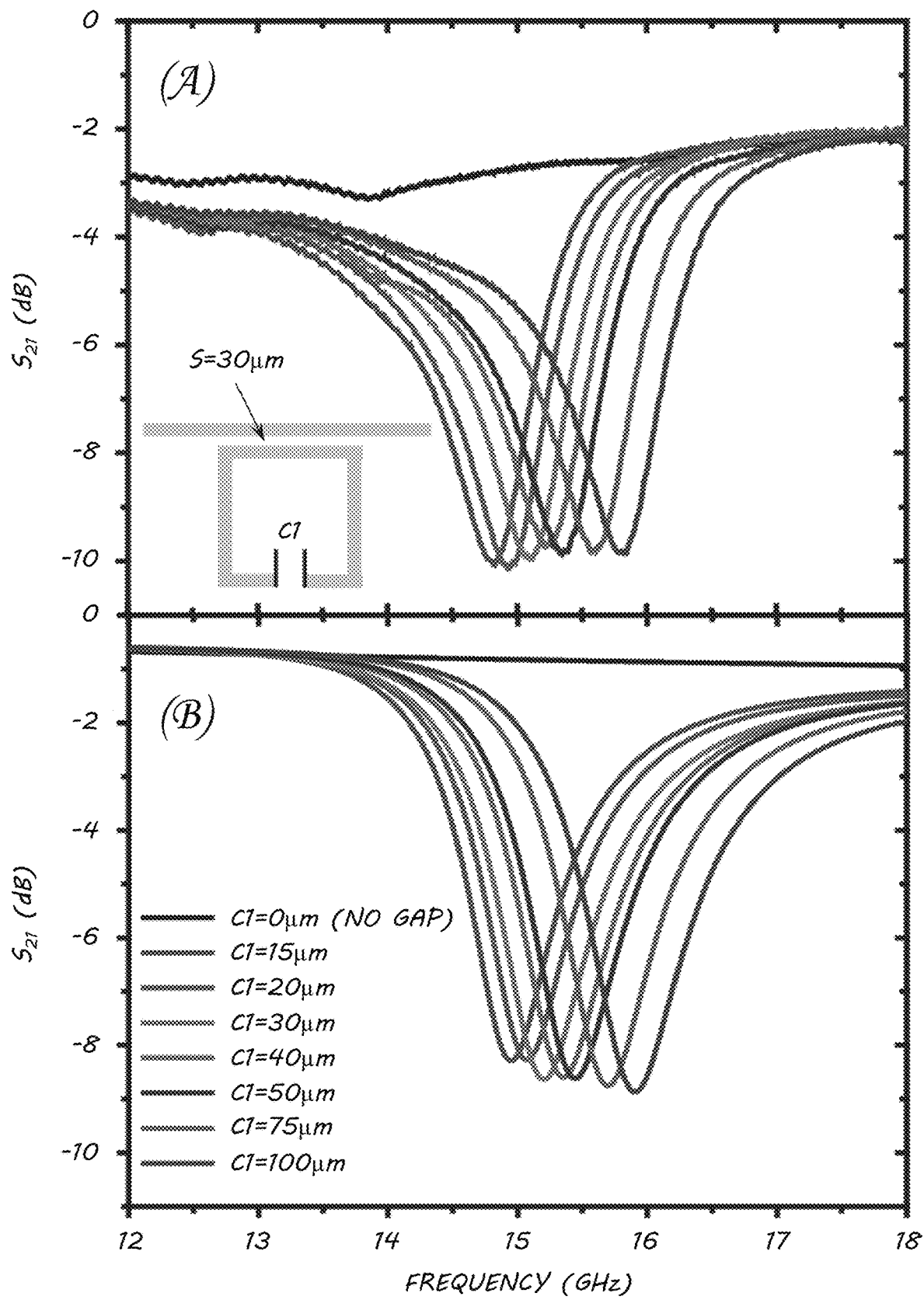
FIGS. 2A-2D contain graphs of experimental and simulated spectral responses.
Figures 2C, 2D:
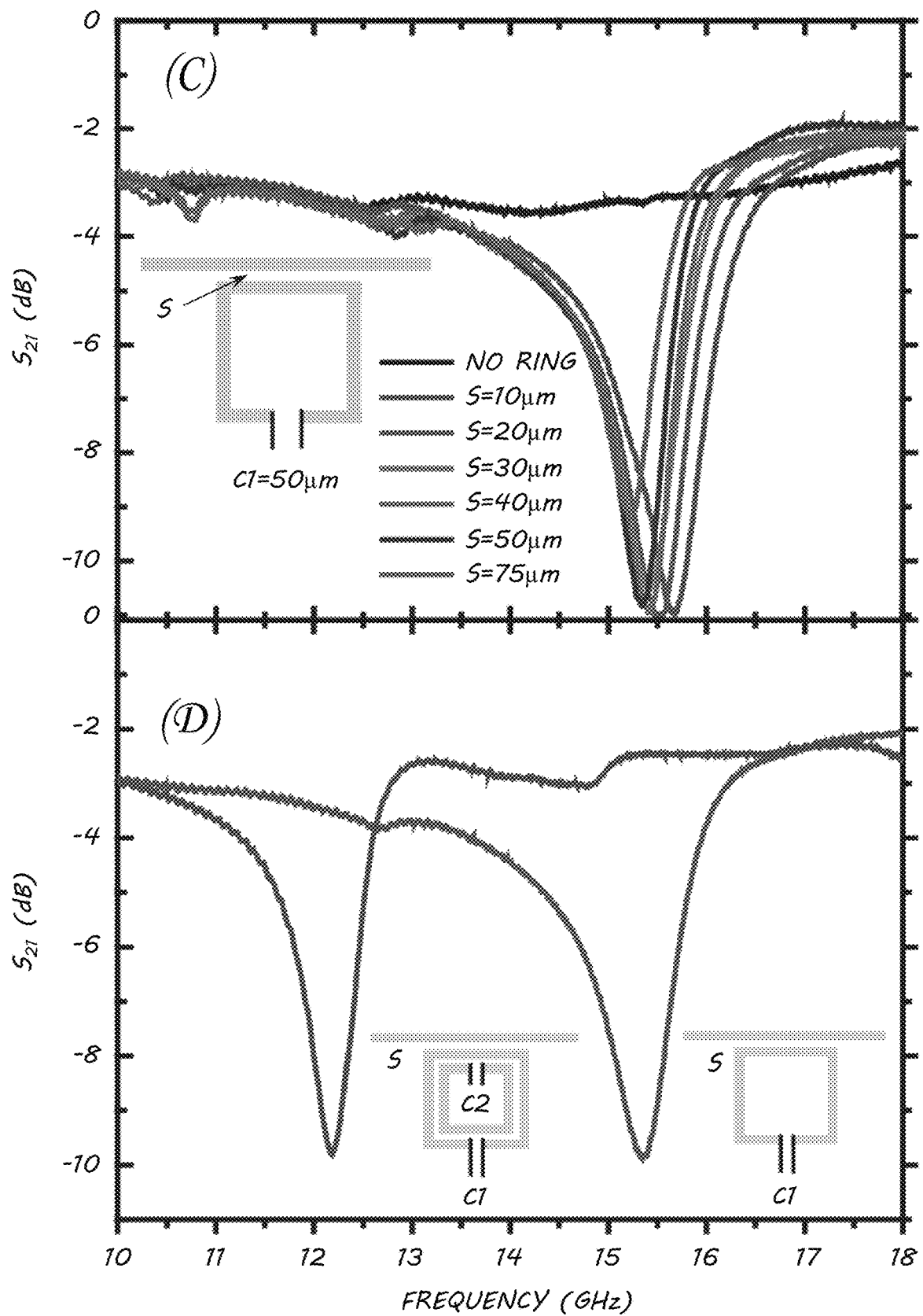

FIGS. 2A-2D show the SRR RF response as a function of the circuit geometry measured on a Vector Network analyzer (VNA) with details. The single SRR circuits in FIGS. 2A and 2B had fixed spacer (S=30 μm) as shown in FIG. 2A and varying capacitive gaps (C1=0 (i.e. No Gap), 15, 20, 30, 40, 50, 75, 100 μm) as shown in FIG. 2B. The single SRR circuit of FIG. 2C had fixed capacitive gap (C1=50 μm) and varying spacers (S=10, 20, 30, 40, 50, 75 μm). The single- and double-SRRs of FIG. 2D had S=30 μm, C1=50 μm, and C2=50 μm. Inner SRR on the double-SRR has side length of 0.8 mm. The position of the RF resonance is primarily determined by SSR geometry. The resonant frequency (±0.5 GHz) can be fine-tuned by controlling the capacitive gap C1 of the SRR. FIG. 2A shows the experimental and FIG. 2B the HFSS simulated RF amplitude transmission |S21| in dB vs. Frequency in GHz for a SRR of side lengths 1 mm, and a spacer of S=30 μm, for a range of capacitive gap values C1=0 . . . 100 μm. Good qualitative agreement is demonstrated between the experimental results and simulations with respect to the depth, linewidth, and spectral shift achieved with changing C1. FIG. 2C shows the experimental RF amplitude transmission spectra |S21| in dB vs. Frequency in GHz for SRRs of side lengths 1 mm, capacitive gaps C1=50 μm, and having a range of coupling gap distances 5=10 . . . 75 μm. The "No Ring" line shows a response for a busline without the SRR, which as expected, shows no resonance. For all S>0, strong resonant features are observed at a frequency of about 15.5 GHz, with decreasing magnitude and linewidth as a function of increasing coupling gap S. Finally, a significant shift of the RF resonant frequency (approx. 3 GHz), and a decrease in linewidth, can be obtained by using a double-SRR structure, as shown in FIG. 2D. Here, the inner SRR has side lengths of 0.8 mm, with C1=C2=50 μm on both SRRs.

For optical characterization in the exemplary embodiment, a diode laser was focused onto the detectors via a 1 inch focal length lens after passing through a spatial filter (not shown). A laser spot size was measured to be approximately 50 μm (Full Width Half Maximum (FWHM)) by replacing the detector sample with a broadband thermal sensor. The laser light incident upon the surface was controlled by both the laser driving current and neutral density (ND) filters in the laser beam path. Laser power absorbed by the GaAs was calculated assuming that light not reflected from the GaAs/air interface is absorbed in the GaAs. Some light is reflected from the Au SRR and the values shown for absorbed laser power are therefore slight overestimates. Detector spectral response was measured using the VNA for varying laser excitation powers.

Figure 3A:
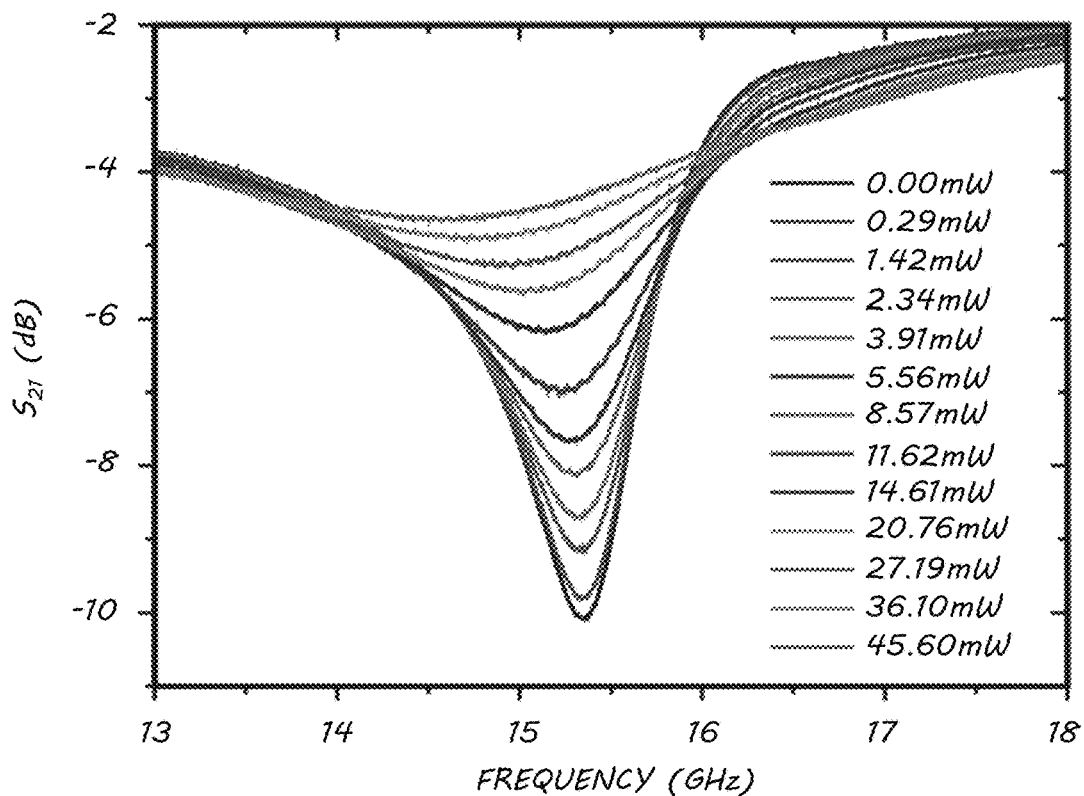
FIGS. 3A and 3B contain graphs of spectra of absorbed laser powers and lock-in amplifier output signal.
Figure 3B:
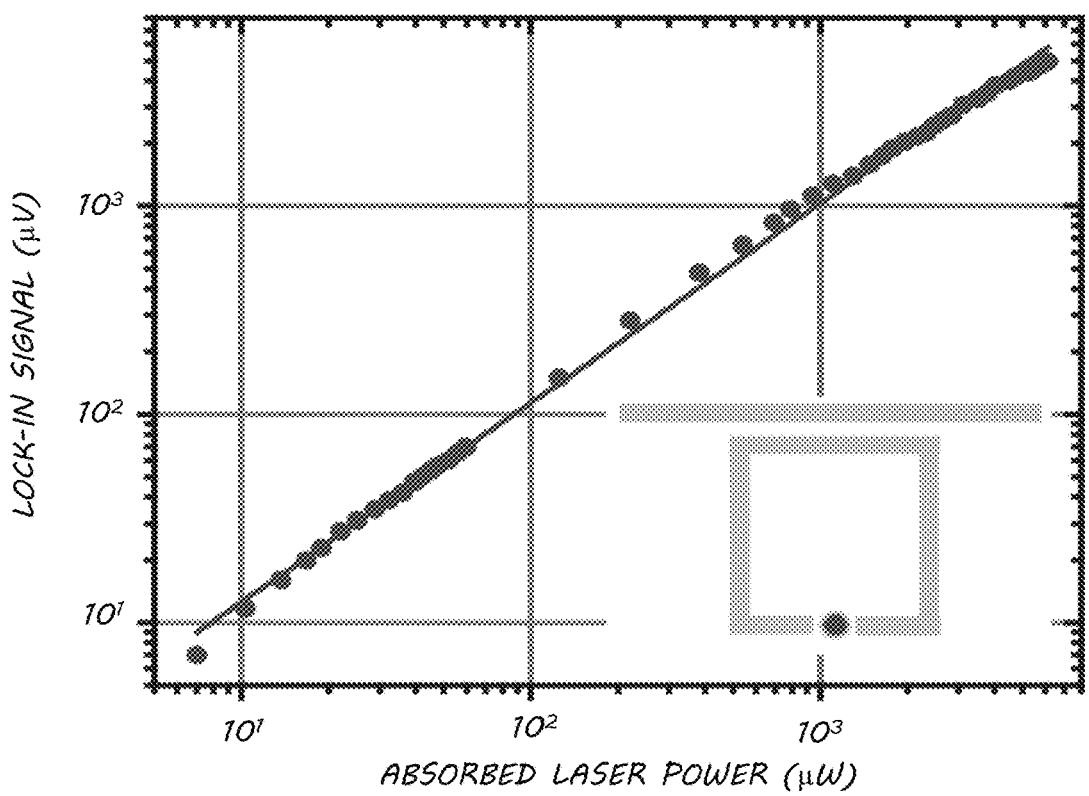

FIG. 3A shows representative scans of the detector response as a function of absorbed laser power from ~0.29 to 45 mW for a 785 nm laser diode in continuous wave operation. The spectrum for the SRR with no light incident on the gap is shown as 0 mW. The graph shows results for absorbed powers from 0 mW to 45.6 mW. The SRR geometry includes side length 1 mm, spacer gap S=30 μm, and capacitive gap $C_1$=50 μm. It is evident from these results that the generation of electron hole pairs in the capacitive gap of the SRR have a significant effect on the response of the SRR circuit, effectively damping the SRR resonance. No response was observed when the laser beam was incident anywhere else on the sample surface. A greater than 5 dB change in the depth of the SRR resonance was observed at absorbed powers of approximately 45 mW. In order to better determine the detector sensitivity, the laser diode was modulated at 50 Hz with a 50% duty cycle pulse, and the transmitted |S21| was measured with a Pasternack 10 MHz-18.5 GHz zero-biased Schottky RF detector. The detector response was measured by a lock-in amplifier (LIA) in volts (V) as a function of laser power using the Schottky diode detector and is linear over a wide range of incident optical powers ($\sim 10$-$10^4$ μW) as illustrated in FIG. 3B. The data in the plot illustrates some sense of the responsivity of the detector in volts per watt (V/W). But, that does not provide the responsivity as usually defined for optical detectors since the numerator scales linearly with the RF voltage from the VNA that was set at 3 dBm. Note from FIG. 3B that incident optical powers may be measured at the μW range. Such sensitivity does not exceed state-of-the-art photodetectors but there are distinct advantages to the detector architecture presented here when compared to standard photodetector devices.

Figure 4A:
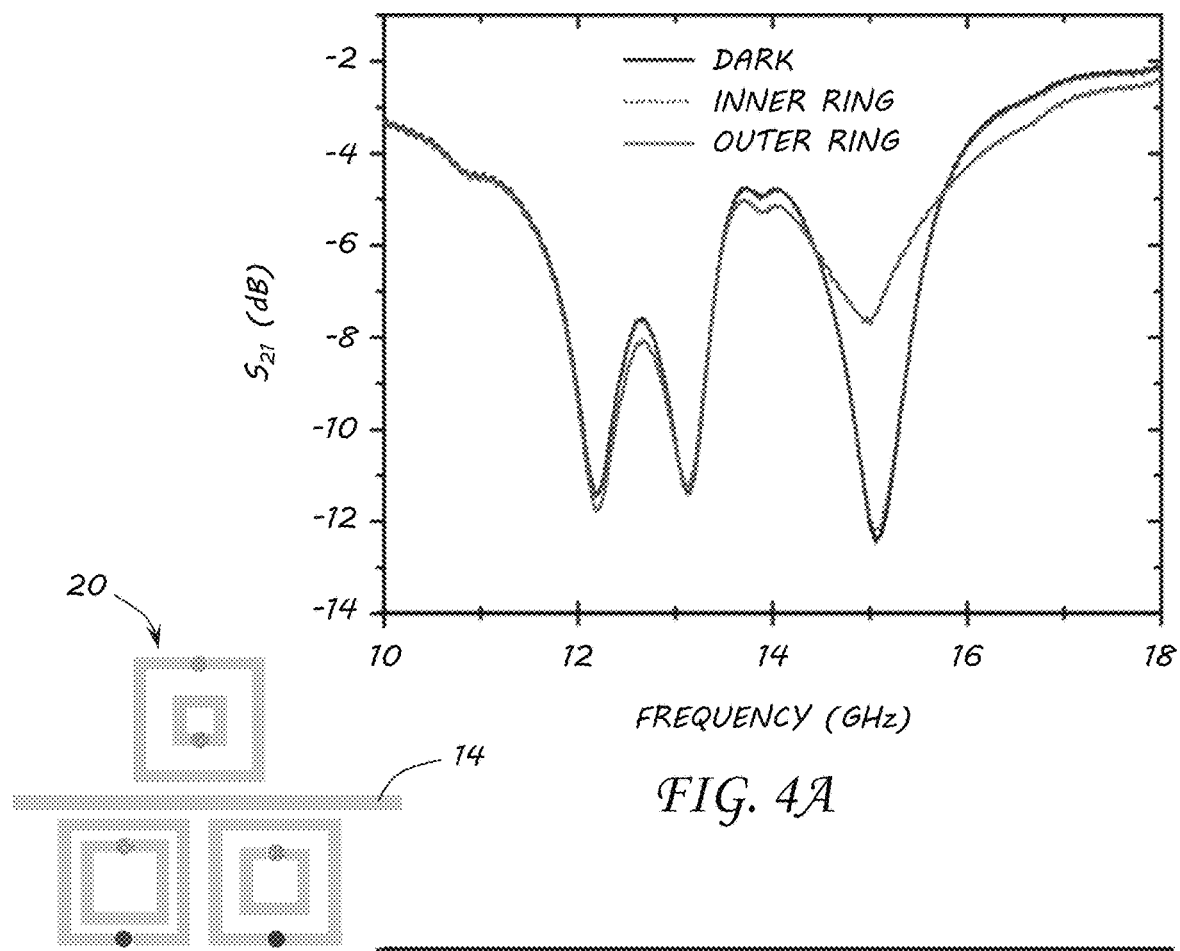
FIGS. 4A-4C contain a schematic and graphs of RF responses of a circuit with three double SRRs on a single bus line.
Figure 4B:
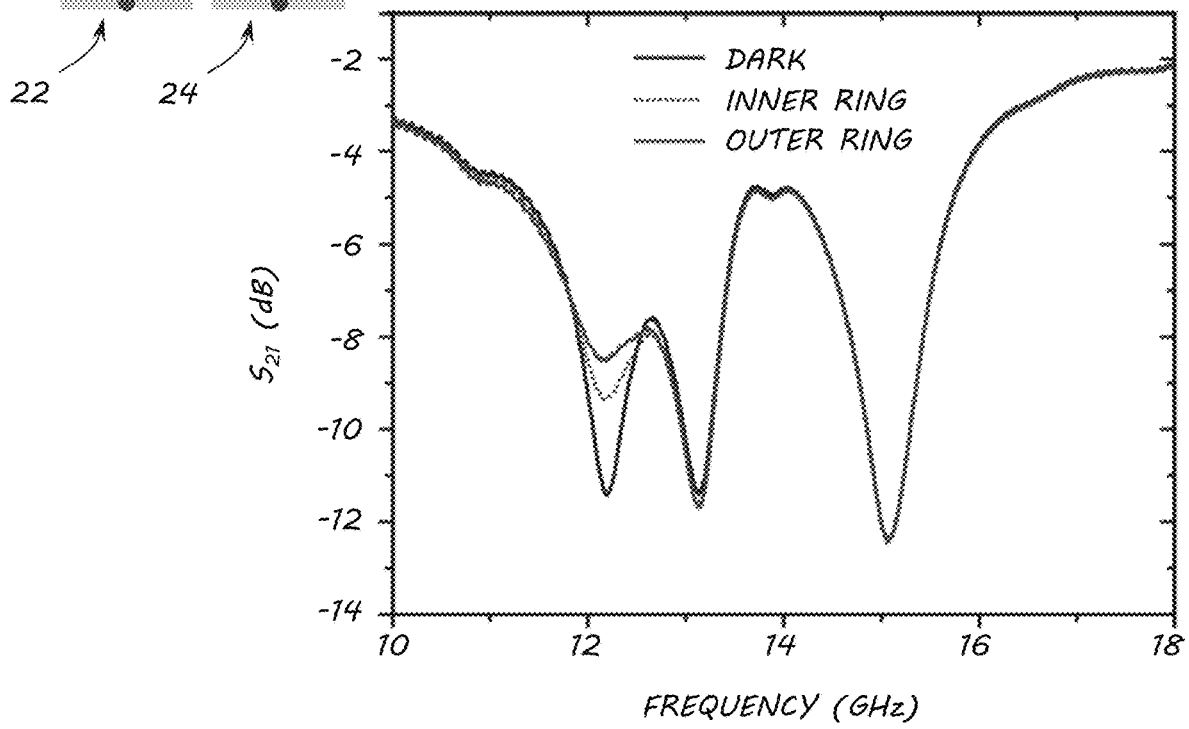
Figures 4C, 5A:
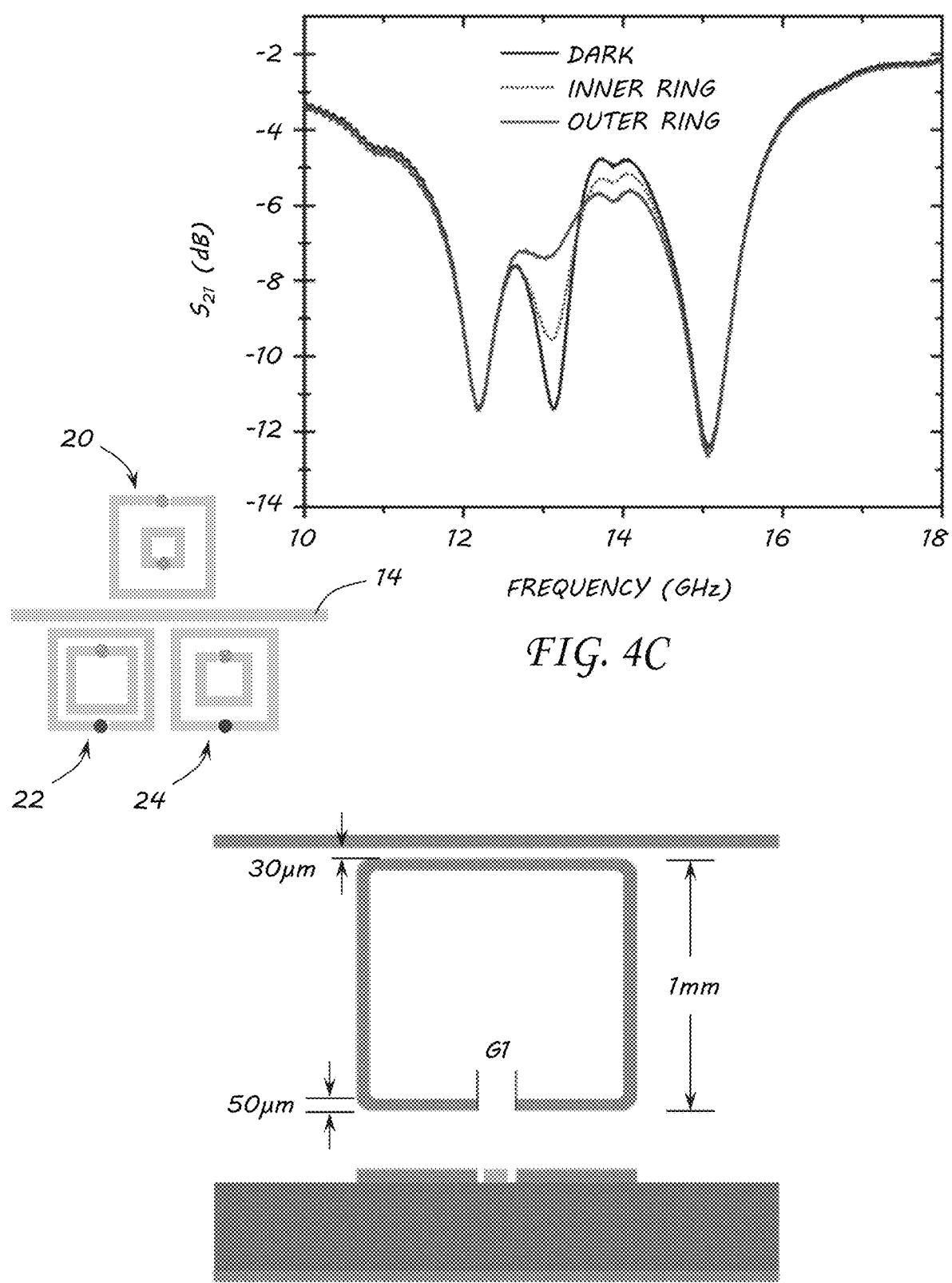
FIG. 5A includes am overhead and cross-sectional schematic of single-element detector with relevant dimensions.

Since the response of each detector element is relegated to the resonant frequency of the SRR associated with it, multiple detectors can be linked to a single busline. Therefore, only a single input and output are required for measuring the detector response given that each detector occupies a separate range in the RF spectrum. FIGS. 4A-4C illustrate an example of such a configuration, with three double-SRR detectors 20, 22, 24 coupled to a single busline 14. In this illustrated example, all double-SRRs have an outer ring side length of 1 mm, with inner ring side lengths of 0.5 mm (20), 0.8 mm (22), and 0.75 mm (24). All SRRs have $C_1$=$C_2$=50 μm and S=30 μm. The RF transmission of the circuit was measured in dark (no illumination) and with laser illumination on each of the SRR's inner and outer capacitive gaps ($C_1$ and $C_2$, respectively). As can be seen from FIGS. 4A-4C, light incident on each SRR can be resolved in the RF spectrum, with minimal cross talk between detector elements. In an alternate embodiment with the current SRR RF linewidth, approximately 10 SRRs could be read out from a single busline across a 10 GHz span of the RF spectrum.

In another illustrated embodiment, the Q of the resonant RF photodetectors illustrated in FIG. 5A is orders of magnitude less than superconducting-KID type detectors resulting in a significant decrease in the resonant RF photodetector sensitivity. The dimensions of the SRR in this embodiment are set to a spacing S=30 μm, length and width of SRR=1 mm, and the gap size is varied from 5-200 μm. Initial responsivity for the devices driven with a 3 dBm RF source on resonance showed responsivities of ~1 V/W. However, despite their weaker response, the resonant RF photodetectors demonstrate several appealing qualities, including configurations that allow readout of multiple detector responses on a single busline (multiplexing), room temperature operation, and potential for very fast response times (orders of magnitude faster than the -KID detectors). Moreover, the resonant RF photodetector architecture can utilize a variety of absorber materials, thus offering significant control over operational wavelength and detector response. Therefore, the resonant RF photo detector architecture could have a range of applications, including material metrology, direct integration of photonic devices with microwave circuitry, and simultaneous (multiplexed) readout of high speed detector arrays.

The ability to control the response of the resonant RF photodetectors (RRFPs) may be accomplished using two distinct approaches: one rooted in the choice of optical/semiconductor materials and the other using the RF resonant geometry of the device.

Figures 5B, 5C:
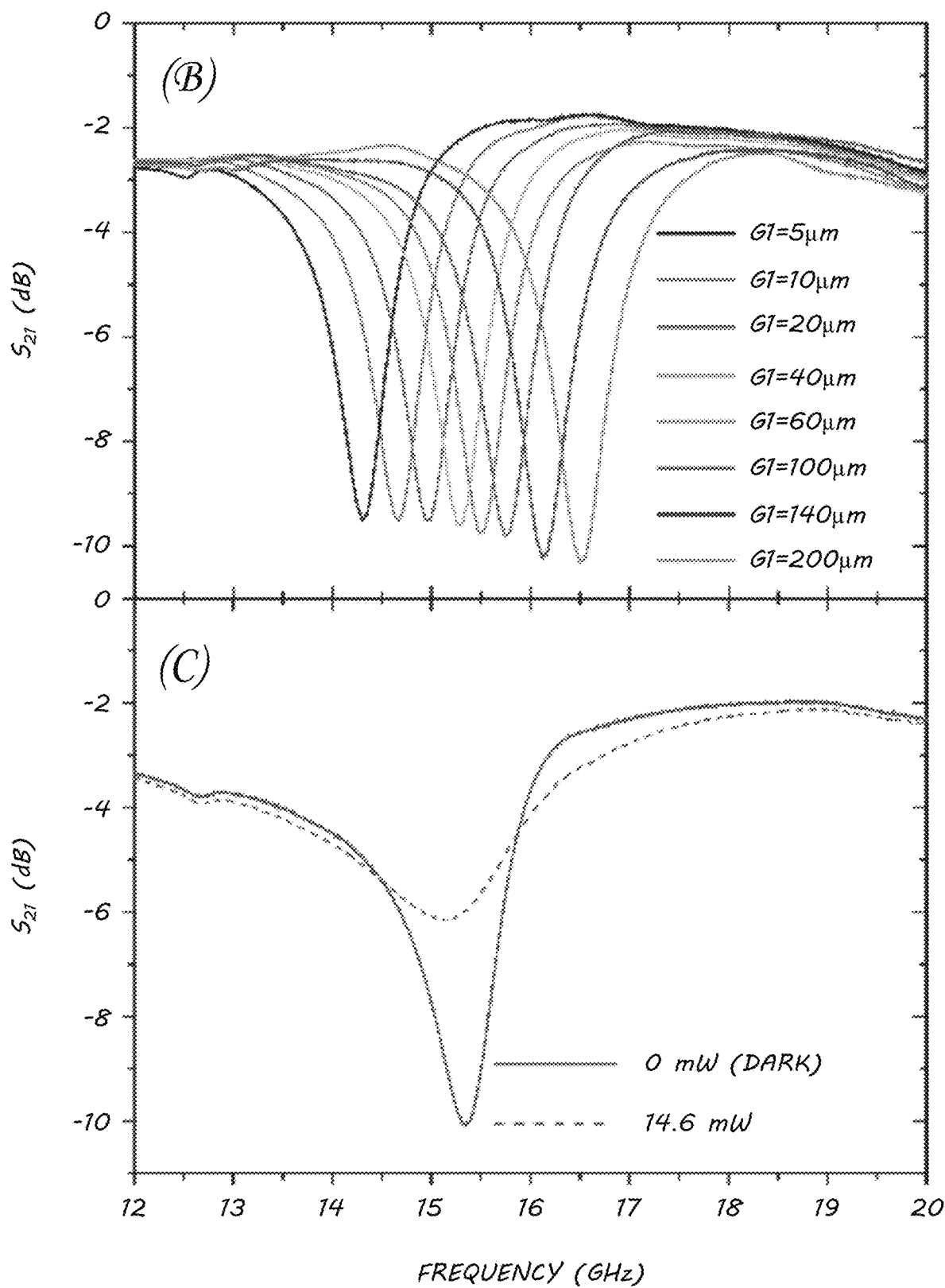
FIG. 5B includes an RF response (insertion loss, $S_{21}$) of detectors fabricated on a SI GaAs wafer as a function of split gap size.
FIG. 5C includes experimental data showing RF spectra of dark (solid) and photo-excited detector (dashed), demonstrating the quenching of the RF resonance under photo-excitation.

Returning to the exemplary detector geometry shown in FIG. 5A, all of the fabricated detectors have 1 mm square SRR structures with chamfered corners to decrease scattering loss. The SRR structures are evanescently coupled to the busline with a coupling gap of 30 µm. The microstrip lines (busline and SRR) are 50 µm wide, 0.5 µm thick Au with a 10 nm Ti adhesion layer. These are patterned using standard UV photolithography, metallization and lift-off processes. The detector ground plane is 0.5 µm thick Au with a 10 nm Ti adhesion layer. The RF spectra of the fabricated structures are characterized using an Agilent 5230A Performance Network Analyzer (PNA) with GSG probes that are calibrated using a Short-Load-Open-Thru technique to move the measurement reference planes to the probe tips. Representative plots of insertion loss ($S_{21}$ in dB vs. Frequency in GHz) for varying SRR capacitive gap widths (G1), in the range of 5-200 µm, in unilluminated RRFP detector structures are shown in FIG. 5B. Light incident on the detector generates electron hole pairs in the absorbing material, which changes the local RF conductivity and effectively 'shorts' the capacitive gap. This short alters the resistance of the RLC circuit and quenches the circuit resonance illustrated in FIG. 5C. The change in the transmitted RF signal across the circuit then corresponds to a measure of the light intensity incident on the detector. The 0 mW (DARK) solid curve in FIG. 5C represents no light incident on the gap and the second dashed curve shows data when 14.6 mW laser power absorbed in the gap. Note that the characteristic impedance of the microstrip lines in the RF circuits is ~100Ω which introduces an impedance mismatch between the probes and the RF circuit. In addition, the thin Au used for the RF circuitry (compared to the RF wavelengths) will also result in some additional RF signal loss. Both of the above will result in less than ideal RF characteristics, but do not have a significant impact on the underlying physics associated with the embodiments of the invention.

Five embodiments were evaluated using different absorber materials: semi-insulating (SI) GaAs, high-resistivity (HR) Si, epitaxial GaAs, epitaxial InAs, and epitaxially grown $In_xGa_{1-x}As$/GaAs quantum wells (QWs) in a GaAs matrix. Wafers were obtained from commercial vendors for the semi-insulating (SI) GaAs and high-resistivity (HR) Si detectors and fabricated the RF circuit directly on wafer 30, as shown in FIG. 6C. The three epitaxially grown absorber layers were each grown on SI GaAs wafers in a SVT molecular beam epitaxy (MBE) system. The epi-GaAs sample simply consists of 500 nm of undoped GaAs grown on the SI GaAs wafer. The QW sample consists of 13 periods of $In_{0.15}Ga_{0.85}As$/GaAs QWs (10 nm/20 nm) grown on a 300 nm GaAs buffer layer. The InGaAs QW sample is designed to have a ground state transition at a wavelength of 950 nm at room temperature (confirmed by photoluminescence measurements).

Because of the unintentional doping of InAs substrates (which will quench the RF signal on the microstrip transmission line), the InAs absorber sample is grown on a SI GaAs wafer, which will have a large lattice mismatch to the InAs epi-layer. The InAs sample consists, from the substrate up, a 200 nm GaAs buffer, followed by a 100 nm GaSb layer, and then 500 nm of InAs (undoped). This follows the approach of S. H. Huang et al. in "Strain relief by periodic misfit arrays for low defect density GaSb on GaAs," Appl. Phys. Lett. 88(13), 131911 (2006), which is incorporated by reference herein in its entirety. Huang demonstrated that the GaSb layer can be used to minimize lattice mismatch induced defect propagation into the epi-InAs. For the detectors using epitaxial material, a mesa of epi-material was patterned to sit in the SRR capacitive gap, and all other epi-material was etched. Thus the RF circuit was effectively fabricated on the SI GaAs wafer 32 and the epi-material 34 sits only in the capacitive gap G1=20 µm of the SRR, as shown in FIG. 6C. This approach is necessary for epi-layer materials which are either strong photoconductors or have unintentional doping, in order to prevent losses along the microstrip lines, away from the resonator capacitive gap.

Figure 6A:
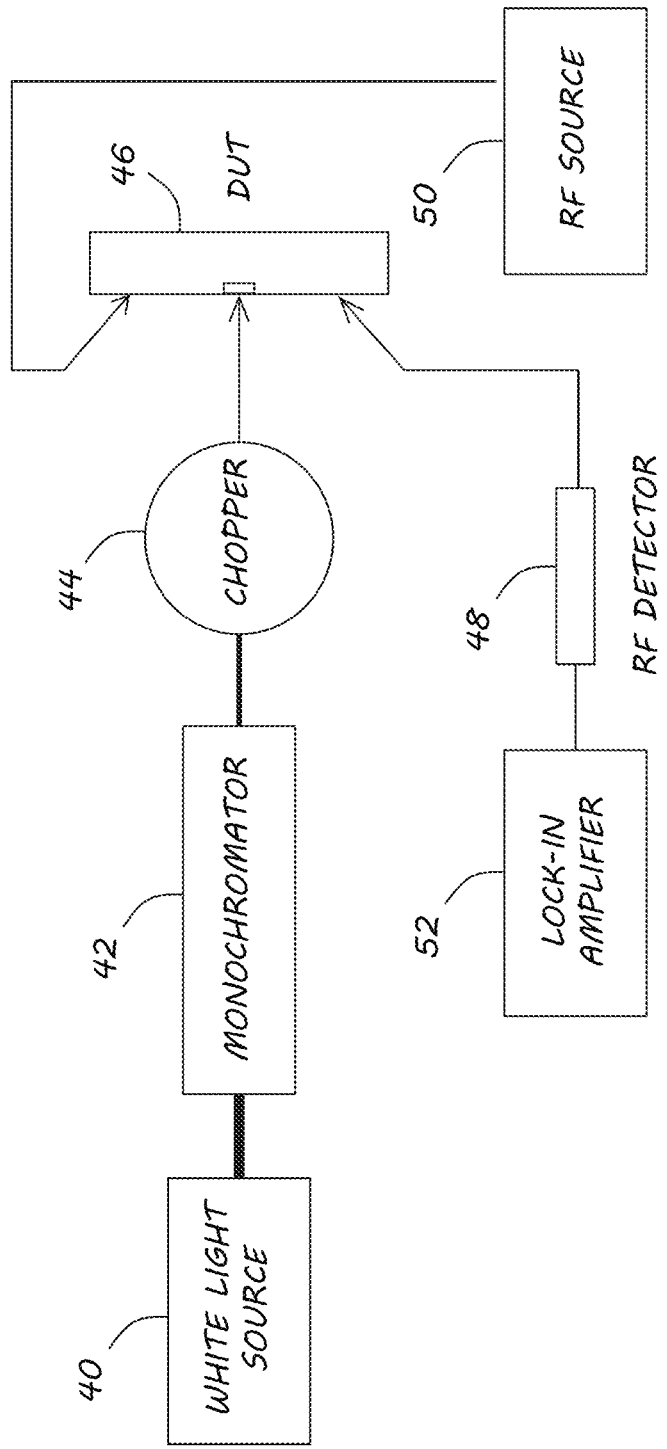
FIG. 6A is a schematic of a spectral response detector.
Figure 7:
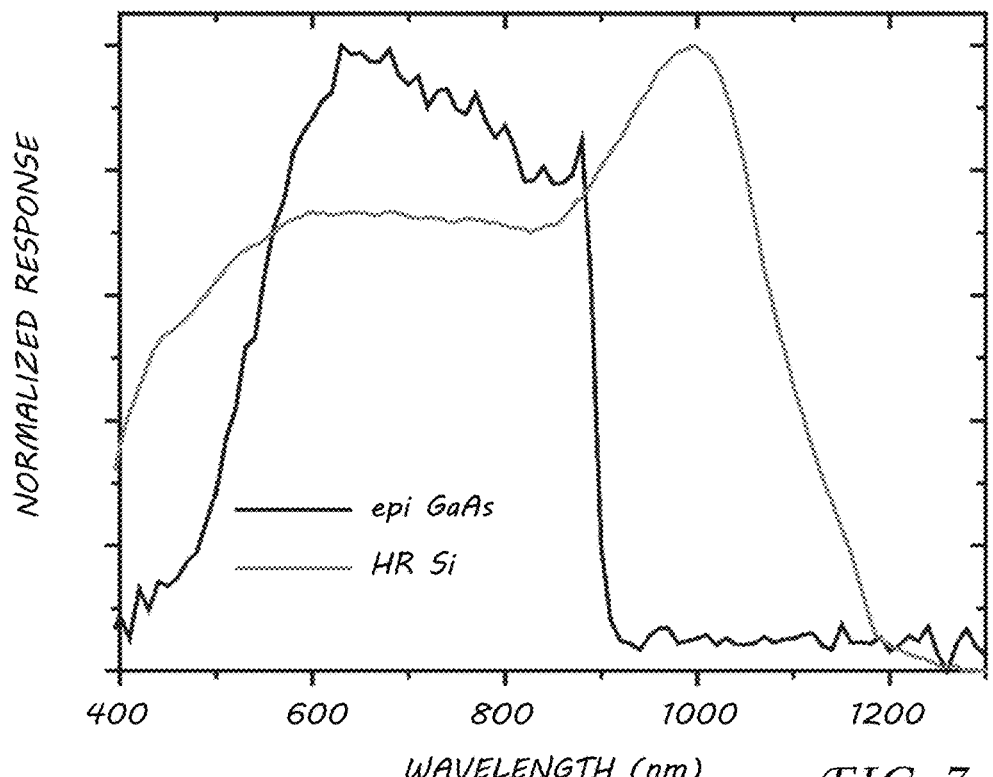
FIG. 7 is a graph of normalized spectral response of the epi-GaAs and HR-Si detector samples.

The (optical) spectral response of detectors was measured using a white light source 40 filtered through a monochromator 42 and chopped by chopper 44 before being focused on the sample 46 (Device under test—DUT), as shown in FIG. 6A. The detectors 48 are driven at resonance with an Agilent (HP) 8341B RF sweep generator (RF Source 50) sourcing 3 dBm. The transmitted RF signal was measured with a Pasternak PE 8013 10 MHz-18.5 GHz zero-biased Schottky RF detector which feeds into the lock-in amplifier 52, synchronized to the optical chopper 44. The detector 48 response is measured as a function of the monochromator wavelength and the resulting optical spectrum is normalized to the incident optical power spectrum as measured in the same set-up with a Thorlabs PM30 power meter. FIG. 7 illustrates the normalized room temperature spectral response of the epi-GaAs and HR-Si detector samples, showing the expected absorption edge at each material's band edge. Other absorber/detector materials can be used to elicit similar responses.

Figure 6B:
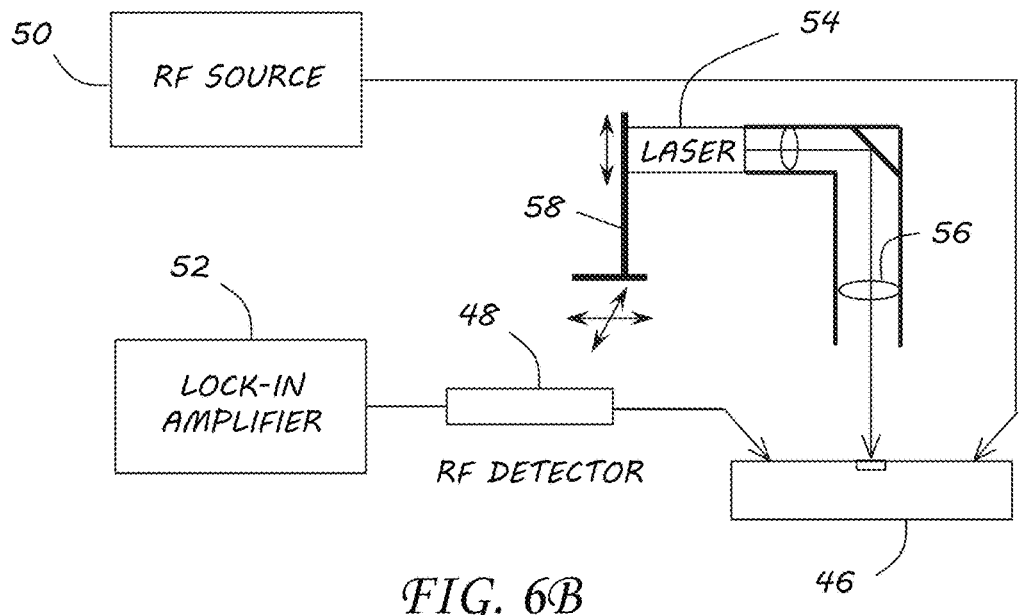
FIG. 6B is a schematic of a spatial response detector.
Figure 6C:
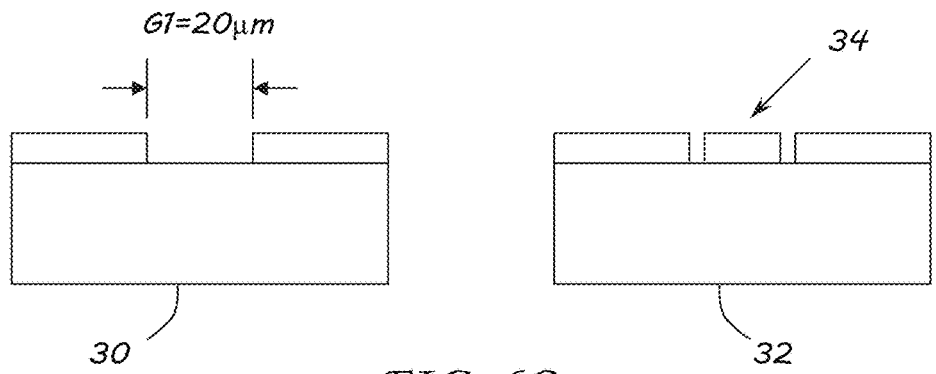
FIG. 6C incudes cross sections of detectors using wafer absorbing material and epitaxial absorbers.
Figure 6D:
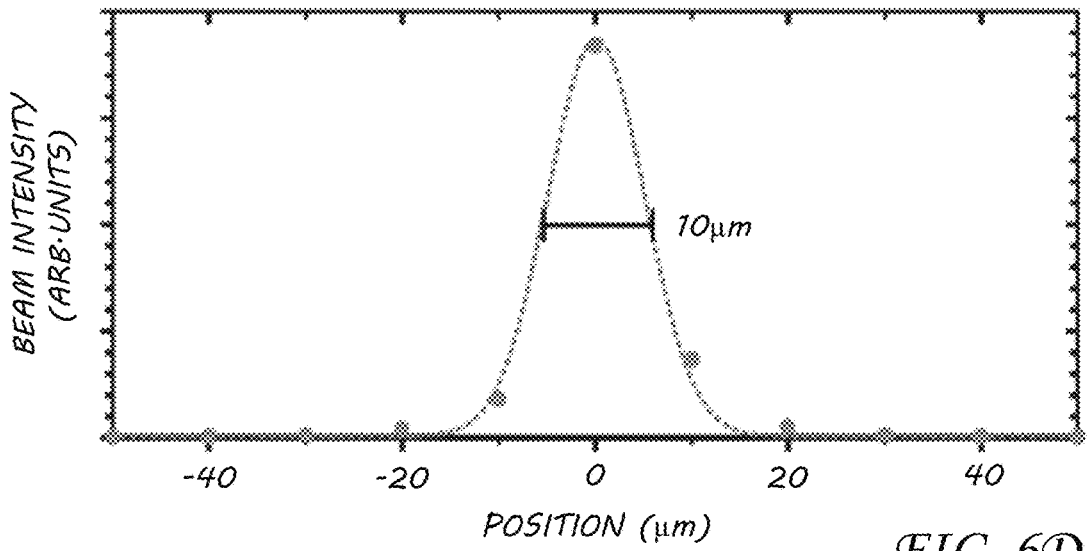
FIG. 6D includes a plot showing the beam profile for the exciting laser in the spatial response set-up.

The responsivity and spatial response of the detectors was measured using the set-up shown in FIG. 6B. Here light from laser 54 is collimated and focused on the sample 46 via a ½" diameter, 1" focal length BK7 lens 56, where the long focal length is required in order to avoid the microwave probes. FIG. 6D shows the beam spot size for the 785 nm laser used in this embodiment, which has a full width half maximum (FWHM) of approximately 10 µm as shown in the figure. The laser 54 is modulated at 50 Hz with a 50% duty cycle for the responsivity measurements. The resonant RF photodetectors (RRFPs) are driven at resonance and the transmitted RF signal is collected and fed into the lock-in amplifier 52 as shown in FIG. 6B. The DC lock-in output is collected for a range of laser powers. Neutral density filters are used to access low incident powers for the laser while allowing the laser 54 to operate at higher current densities and thus stable output powers. Incident laser power is measured using a broadband power meter and responsivities are characterized using the incident, not absorbed, laser power. The absorbed laser power will be ~30% less than the incident laser power due to reflection from the semiconductor surface. For spatial measurements, the laser is mounted on a 1D motorized translational stage 58 as shown in FIG. 6B to allow positioning of the laser spot across the surface of the sample. Linear scans of the sample response were collected, travelling through the capacitive gap either perpendicular or parallel to the microstrip busline.

Driven modal simulations of the devices were carried out using the finite element based software HFSS® available from ANSYS, Inc. The substrate is modeled as a constant permittivity dielectric and all metallic components were modeled as finite conductivity boundaries. Radiation boundary conditions were assigned to all exterior boundaries of the simulation domain, except the ground plane. The remaining computational area was characterized as a vacuum domain. Wave ports were placed on the external boundary of each end of the micros trip line. The two-dimensional Eigen value problem was solved to find the waveguide modes so the modal complex propagation constants and characteristic impedances can be computed. The generated mode patterns were used as excitation for the device and also for computation of the S-parameters. In addition to the determination of the RRFP's RF spectra, the simulations were used to extract the electric fields of our devices on resonance.

The architecture associated with the above illustrated embodiment may be integrated with a range of absorber materials. Choice of absorber material not only allows for control of operational wavelengths of the detectors but also responsivity. Though in these embodiments absorbing substrates were investigated with or without epilayer absorbers, the RRFP architecture also allows for transparent substrates, with absorbing materials placed in the capacitive gap. In all cases the detector response is directly related to the conductivity of the absorber material under illumination, and in this regard is very similar to a traditional photoconductive detector. However, the detector measures changes in the transfer function of a microwave RLC circuit driven on resonance due to a change in RLC resistance vs. simply a change in the quasi-DC voltage across a traditional photoconducting element. The conductivity, σ, of the semiconductor can be written as:

$$\sigma = q(\mu_n n + \mu_p p), \mu_{n,p} = \frac{qm^*_{n,p}}{\tau_{sc}}, n = p = G\tau_r \qquad (1)$$

Where q is the electron charge constant, $\mu_n$ and $\mu_p$ are the electron and hole mobility, $m^*_{n,p}$ is effective mass of electron, hole, $\tau_r$ is carrier recombination lifetime, G is carrier generation rate, and n and p are the electron and hole concentrations, in $cm^{-3}$. The mobility of the material depends on the effective mass of the carrier and the carrier scattering time ($\tau_{sc}$). The steady state electron hole pair (EHP) concentrations, for an optically pumped intrinsic semiconductor, are given by the product of the generation rate (in $cm^{-3}s^{-1}$) and the EHP lifetime (in s). For identical RF resonator and microstrip waveguide designs, the responsivity of the detector depends to first order on the product of mobility and EHP lifetime. However, as for any detector, there are trade-offs associated with improved responsivity. In particular, while RRFPs using materials with long EHP lifetimes will have high responsivity, their frequency response will be limited by the time required for EHPs to recombine. Detectors with high Q RF resonators will also improve responsivity, but again, at the cost of slower response times (as the larger energy storage in the high Q resonators will take longer to dissipate).

Figure 8:
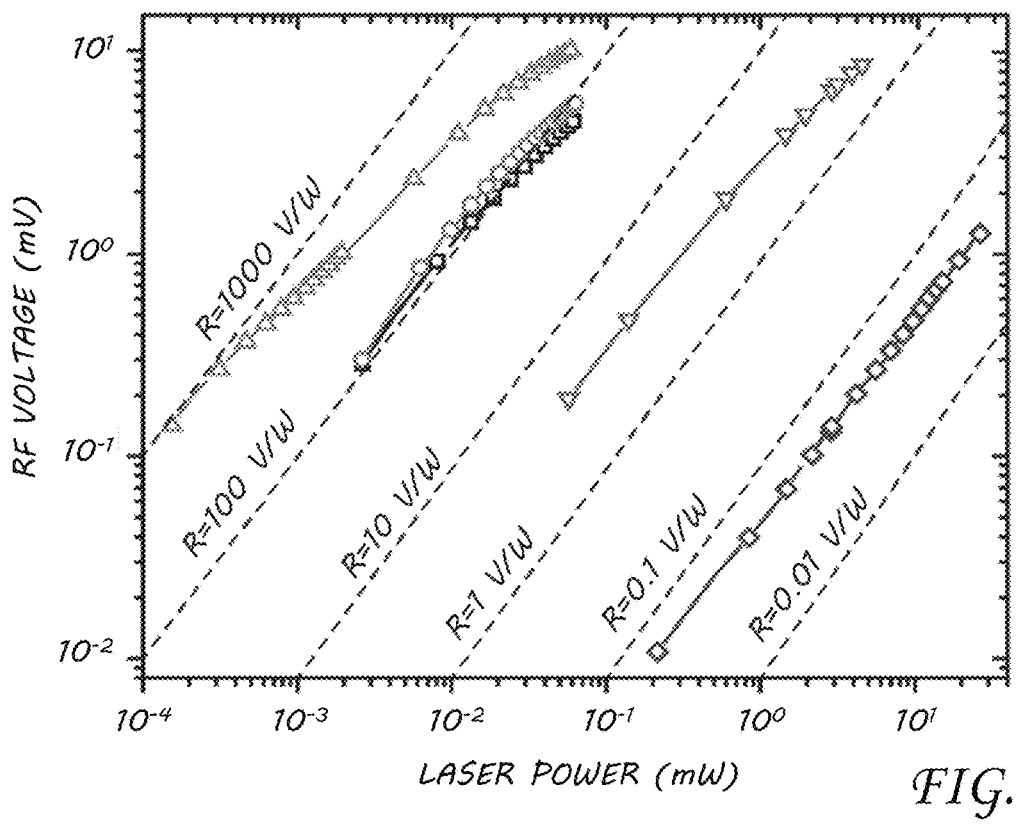
FIG. 8 includes a graph showing transmitted (readout) signal as a function of incident optical power for RRFPs with capacitive gaps G1=20 μm using different absorber materials: epitaxial InAs (green), InGaAs/GaAs QWs (blue), and epitaxial GaAs (grey), as well as wafers of SI GaAs (black) and HR Si (red) with the legend shown in FIG. 8A.
Figure 8A:
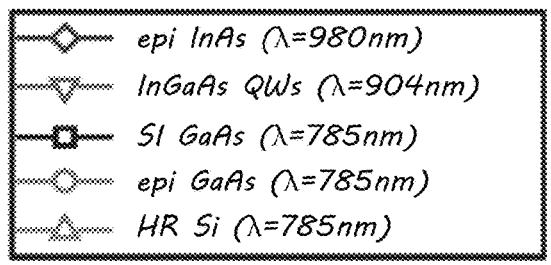

In an ideal detector, both the mobility and the EHP lifetime are independent of carrier concentration, resulting in a linear response. However, at high carrier concentrations, both mobility and EHP lifetime decrease, due to increased effects of additional scattering mechanisms (Auger recombination, electron-electron scattering, etc.). Additional nonlinearity at high pumping powers may result from the shift of the quenched RLC resonance compared to the 'dark' circuit. The trade-off between linearity and responsivity can be clearly seen in FIG. 8, which shows the change in the transmitted signal through the RF detector circuit as a function of incident optical power for 5 different absorber materials placed in a 20 μm gap of a single SRR. The R-values obtained for the 5 different absorber materials shown in FIG. 8 are approximately 1000V/W for High Resistivity Silicon (HR-Si), 100 V/w for epi-GaAs and Semi-insulating GaAs (SI GaAs), 8 V/W for InGaAs/GaAs quantum wells, and 0.1V/W for epi-InAs, with corresponding wavelengths between 980 nm to 785 nm each of the absorber materials shown in the legend to FIG. 8 in FIG. 8A. Narrow bandgap InAs shows the most linear response, but also the weakest responsivity. Both effects can be attributed to the rapid EHP recombination in InAs at room temperature, which more than negates the somewhat higher mobility of epitaxial InAs compared to other absorber materials. The short lifetime of the epi-InAs results in low carrier concentrations and consequently a weak, though linear, response. Note that the InAs absorber RRFP is pumped with a 980 nm laser, which has a photon energy three times the InAs bandgap, and thus is a less than efficient optical pump. Thus the results for the InAs absorber RRFP shown in FIG. 8 underestimates the InAs responsivity if pumped with a longer wavelength optical source. The InGaAs/GaAs QW sample was pumped below the GaAs band edge but above the QW ground state transition (with a 904 nm laser diode). This sample shows a significantly stronger response when compared to the InAs, which can be attributed to both the more efficient pumping and the improvement in carrier lifetime of the epitaxial QWs. However, the QW response is still more than an order of magnitude weaker than the bulk GaAs response, as expected due to the limited volumetric fill factor of the QWs. Finally, the HR Si sample shows the highest sensitivity, with responsivities as high as 1,000 V/W at low optical powers. The HR Si clearly shows significant nonlinearity in response resulting from the larger carrier concentrations achievable with the long carrier lifetimes (on the order of hundreds of μs) for photoexcited EHPs in Si. The combination of the detector nonlinearity and the limitations in response time associated with the resonant RF circuit indicates that the detectors presented here are unlikely to find application in RF photonic applications requiring highly linear detection of optical signals modulated at microwave frequencies. However, for applications requiring either multiplexed detection schemes or direct RF readouts of optical signals (or material properties) at low-GHz frequencies, our detector architecture may have benefits.

FIGS. 7 and 8 demonstrate that the choice of optical absorber material in the detector design cannot only determine operational wavelength of the detector, but also its responsivity and the linearity of that response. In addition, the choice of absorber material may also strongly affect the time response of the detector via the EHP lifetime and charge carrier mobilities. The absorber material, however, is not the only parameter available to engineer the responsivity of RRFP devices. Detector responsivity also depends significantly on the geometry of the RF circuit and the location of EHP generation. The latter can be clearly seen in FIGS. 9A and 9B, where the response to a fixed laser intensity is plotted as a function of the incident laser position on the SI-GaAs detector with the 80 μm gap size. Each curve in FIG. 9B. correlates to the dashed lines (i-v) in FIG. 9A that are raster scans of the incident laser from 600 μm to the left and right of the gap center (denoted as 0 μm on the graph) where the detector response is measured.

Figure 9A:
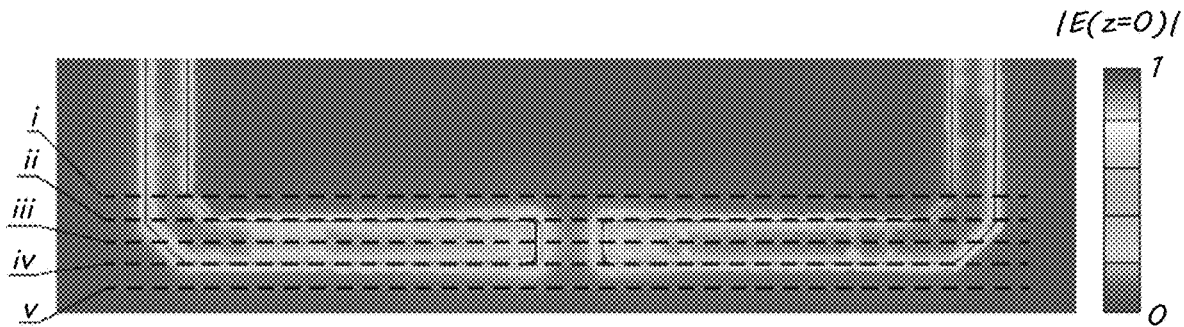
FIG. 9A includes a simulated electric field distribution, on resonance, for the bottom arms of the SRR on a RRFP resonant circuit with 80 μm capacitive gap.
Figure 9B:
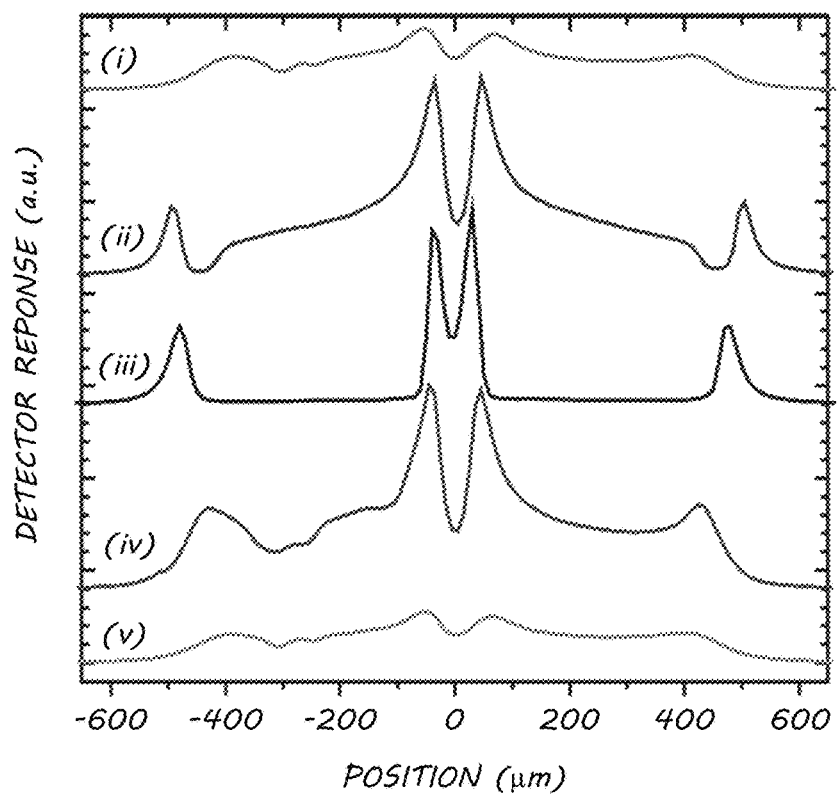
FIG. 9B includes a detector response as a function of the position of the incident laser along the bottom arms of the RF resonant detector simulated in FIG. 9A.
Figure 10A:
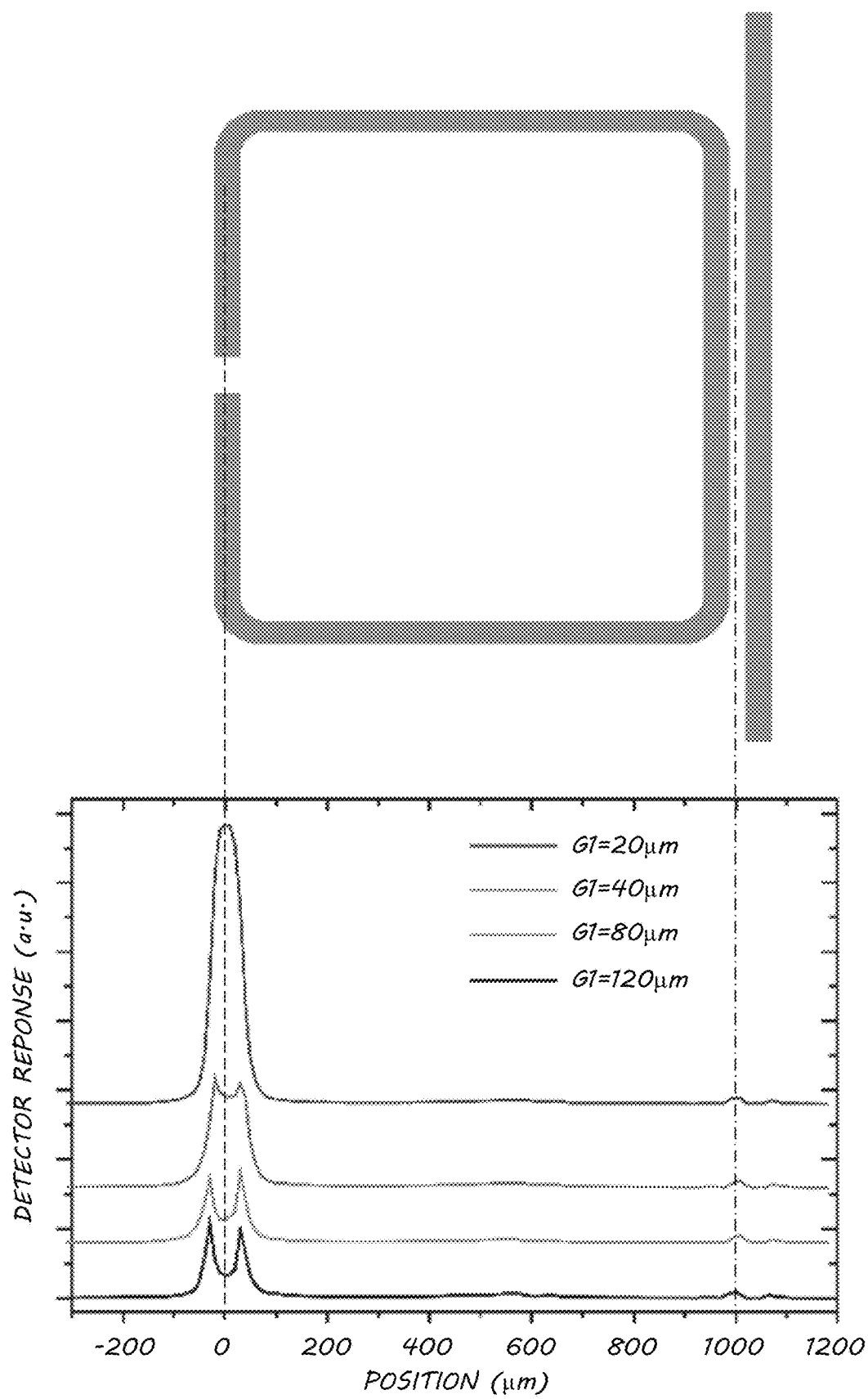
FIG. 10A is a schematic of an RF resonant circuit and a graph of a detector response as a function of position perpendicular to busline, through capacitive gap.
Figure 10B:
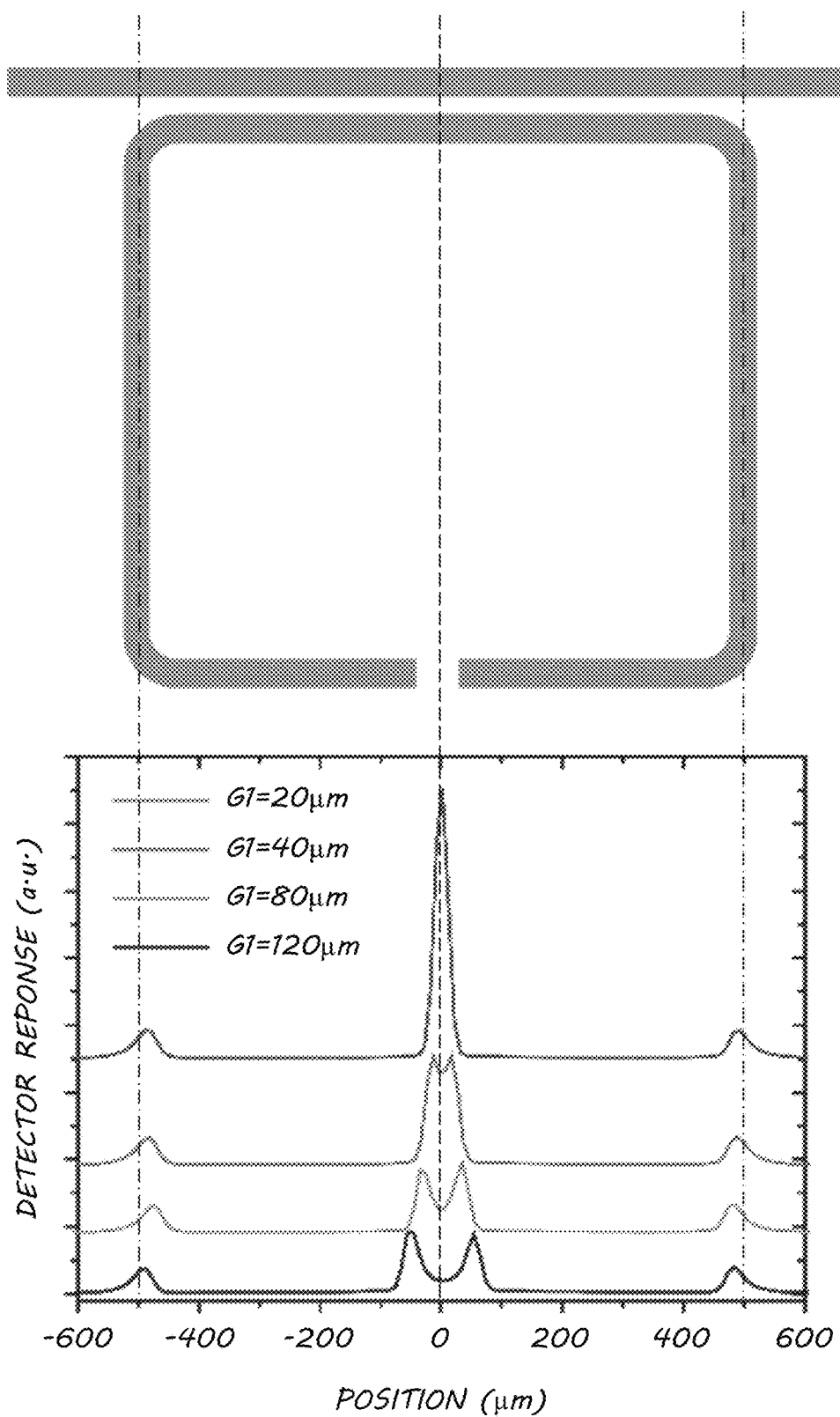
FIG. 10B schematic of an RF resonant circuit and a graph of a detector response as a function of position parallel to busline through capacitive gap.

The data in FIGS. 9A and 9B shows a strong variation in detector response with the position of the incident laser. In this respect, the RRFP differs significantly from a traditional photoconductive device. In a standard photoconductor, a largely uniform DC field between the detector contacts will result in a uniform spatial response across the detector surface. In FIGS. 9A and 9B, however, it is observed that the RF detector response varies significantly with spatial location along the surface of a single detector. When comparing the linear scans of detector response to the simulated RF field intensity for the resonant circuit, it becomes clear that the detector response is maximized at the locations where the RF field is enhanced. Local maxima were observed in the detector response at locations where bends in the SRR result in fringing fields extending out from under the microstrip lines, such as at the x=±500 μm positions on the bottom arms of the SRR. Intuitively, this can be understood by thinking of the excited EHPs as generating a localized loss in the RF circuit. The stronger the overlap of this localized loss with the RF field, the stronger the detector response. Thus, the strongest detector response is observed at locations where the RF field is strongest. While for a given detector geometry a wide range of responsivities can be achieved dependent on the position of the incident light, the above results also suggest that the detector responsivity to be engineered using design of the RF resonator. An alternate embodiment illustrated in FIGS. 10A and 10B shows the detector response as a function of position along the bottom arms of the SRR, parallel to the micros trip busline [FIG. 10B], and across the SRR, perpendicular to the busline and through the center of the capacitive gap [FIG. 10A] for four detector structures fabricated on SI GaAs wafers, identical except for the capacitive gap size GI that varies from 20 to 120 μm. Each curve represents a raster scan of incident light for 600 μm on either side from center of the capacitive gap (denoted as 0 μm on the graph).

The simulations in FIGS. 10C-10F show the on-resonance RF electric field normalized to a scale of 0-1 where 1 represents the maximum value of the electric field measured typically in the center of the gap. The value are shown at the semiconductor surface of the four detector geometries where the gap size is varied from 20 to 120 μm as experimentally investigated in FIGS. 10A and 10B. As can be seen in these simulations, the enhancement of the electric field in the SRR gap increases significantly with decreasing gap size, as the mode is effectively 'squeezed' into a smaller volume between the SRR arms. This increases the enhancement of local (RF) electric field strength and should result in a stronger responsivity for the detector structures with smaller gap sizes. This effect is observed in FIGS. 10A and 10B, where two distinct effects can be seen with decreasing gap size. First, the linear scan of the detector response shifts from a double peak structure, with strong response at the ends of the SRR arms, to a single peak response, with strong response centered in the SRR gap. Second, a significant increase can be observed in the detector responsivity with decreasing gap size, with about a four times increase in the transmitted signal for equal incident laser power. Both of these effects are supported by the RF electric field profiles simulated in FIGS. 10C-10F.

The responsivity of the RRFP devices in V/W, fabricated on a GaAs wafer, as a function of SRR gap size is shown in FIG. 11 for gap sizes varied from 10-120 μm. Here, for each RRFP device, the incident light (785 nm laser) was positioned at the spatial position on the SRR which produces the largest signal. For the larger gap structures, this is located at the edge of one of the arms. For the smaller gap structures, this is located in the middle of the gap. A clear increase in response is seen as the SRR gap size decreases. As gap sizes decrease below 20 μm, however, the gains in responsivity increase only slightly. This is a result of increased reflection of the incident light from the SRR arms, as the laser spot FWHM is ~10 μm [FIG. 6D]. Therefore, decreasing gap sizes increases shadowing of the semiconductor absorber material from the incident light. Overall, these results show that significant improvement in responsivity can achieved in RRFP devices by engineering RF hot-spots. As can be seen in FIG. 5B, the change in SRR gap size does not significantly change the RF properties of the SRR (slight change in resonant frequency, little change in resonator Q) but has a drastic effect on the device responsivity. This suggests that resonator designs with engineered RF hot-spots giving even greater field enhancement could be used to further improve the response of the presented detector devices.

Embodiments of the invention may be utilized over a number of different applications. For example, semiconductor based devices operating at microwave frequencies are of increasing importance for the technologically vital fields of high-speed electronics, on-chip, fiber-based, and free-space communication, and next-generation optoelectronics. These devices, because they operate in the radio frequency (RF) portion of the electromagnetic spectrum, generally require RF-based passive circuitry to drive and/or read out device response. While designing such circuitry has been greatly simplified over the past decade with the increase in computational power and a host of commercially available software packages, experimental characterization of these circuits can be a costly, time-consuming, and oftentimes low-resolution process. Yet understanding the field distribution and loss mechanisms for fabricated, operational RF circuitry can provide invaluable feedback in the iterative design process.

Experimentally mapping fields in RF circuitry is traditionally achieved using a microwave near-field scanning microscope. In such a set-up, an open-ended coaxial cable is scanned above the surface of the sample. In passive imaging mode, an RF signal propagates along the cable and is reflected from the sample surface. The measure of reflection depends on the conductivity of the sample when the probe is in close proximity to the surface, allowing for a readout of the surface conductivity. In active mode, the circuit is driven with a microwave signal, and the coaxial probe picks up scattered evanescent fields, and thus maps out the scattered field across the circuit. Improvements in spatial resolution have been achieved by replacing the open-ended coaxial cable with an ultra-subwavelength parallel strip transmission line or alternatively, a scanning tunneling microscopy (STM) tip, allowing for nm-scale resolution measurements of material conductivity. Such measurement techniques are non-destructive and contactless, but suffer from the severe length scale mismatch between the RF signal wave-lengths and the probe itself, resulting in weak coupling and limited sensitivity. Thus, measurements of material properties are possible, but measurement of field profiles, which requires coupling of scattered fields into a subwavelength microwave probe, are significantly more difficult with these techniques.

More recently, a field mapping technique utilizing electro-optic (EO) birefringence has been shown to produce sub-wavelength resolution, three-dimensional, electric field vector profiles of active RF circuits. In these techniques, a picosecond or faster pulsed laser is reflected from either an RF circuit fabricated on an EO material, or an EO material placed in the near field of the RF circuit. The polarization shift of the RF field-induced birefringence is measured and used to extract the amplitude and direction of the RF field at the laser spot position. However, EO sampling requires expensive microwave and optical equipment, including network analyzers, femtosecond-lasers, and EO crystals. In addition, because these systems use light at frequencies where the circuit dielectric is transparent, the polarization shift of the probe beam results from the entire length of its travel in the EO material, limiting spatial resolution along the optical axis. Nonetheless, optical probing of RF circuitry is a particularly appealing approach for mapping fields due the significant mismatch in wavelength and time scale between RF and optical frequency bands, allowing for high temporal and spatial resolution.

Embodiments of the invention may be used as a relatively inexpensive method for measuring field profiles of RF circuitry is presented, which is dubbed Microwave Mapping with Optically Induced Conductivity (MMOIC). The MMOIC technique provides a contactless, nondestructive approach to measure the field profile of active RF circuits. Like the EO sampling technique, MMOIC allows for field mapping (though magnitude, not direction) with a spatial resolution orders of magnitude below the free-space wavelength of the RF signals in our circuits.

Figure 12A:
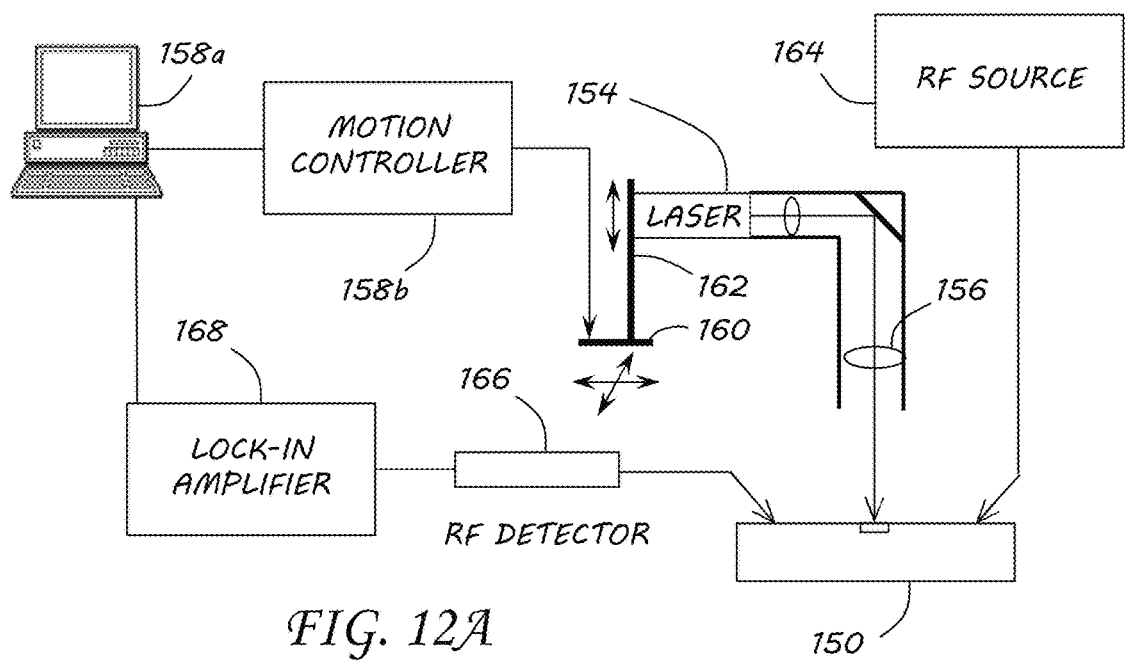
FIG. 12A includes a schematic of experimental set-up for microwave field mapping.
Figure 12B:
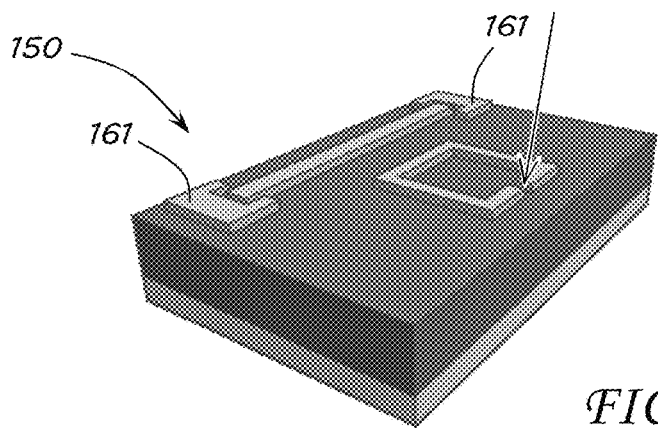
FIG. 12B includes a schematic of resonant circuit from FIG. 12A showing laser beam incident upon the surface.
Figure 12C:
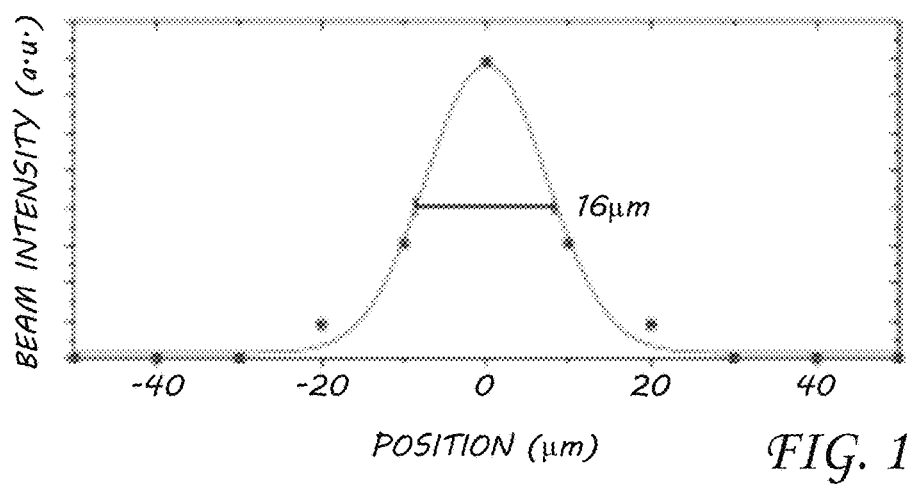
FIG. 12C is a graph of an experimental measurement of 785 nm laser beam spot size on sample surface, with FWHM~16 μm.

In MMOIC, an RF circuit driven by a microwave source is illuminated with a focused laser beam having a photon energy above the band gap of the circuit dielectric. As with the embodiments illustrated above, the laser light will optically excite electron hole pairs (EHPs) in the dielectric, and these excited charge carriers will alter the local conductivity of the material, essentially providing a localized complex conductivity. This modulation of the circuit can be read out in the circuit response, and will be proportional to the spatial overlap of the RF field with the localized region of altered conductivity. A schematic of this illustrated embodiment is shown in FIGS. 12A and 12B. In this set-up, a sample 150 is mounted on a vacuum chuck not shown) and GSG probes 161 (FIG. 12B) placed at the ends of the microstrip busline. Laser light from a 785 nm laser diode 154 is incident upon the sample, focused using a ½" diameter, 1" focal length BK7 lens 156 as shown in FIG. 12A, where the long focal length is required in order to avoid the microwave probes. FIG. 12C shows the laser beam spot size at the sample surface, which has a full width half maximum (FWHM) of approximately 16 µm where the x-axis indicated the position of the laser light on SRR bottom arm such that in the figure −50 µm indicates one end and +50 µm with zero placed at the center of the gap whereas the y-axis shows beam intensity for the laser light. The laser 154 is modulated at 47.9 Hz with a 50% duty cycle, and is mounted on two computer controlled (computer 158a to motion controller 158b), motorized translational stages 160, 162 as shown in FIG. 12A. The RF circuits are driven with an Agilent (HP) 8341B RF sweep generator (RF Source 164) sourcing 3 dBm, and the transmitted signal is collected with a Pasternak PE 8013 10 MHz-18.5 GHz zero-biased Schottky detector 166 which feeds into a lock-in amplifier (LIA) 68 referencing the laser modulation as shown in FIG. 12A. The DC output of the LIA is collected for each scan step of the 2D stage, providing a signal proportional to the optical modulation of the RF circuit. Scans of the circuits were obtained with 10 µm spatial step sizes, with a 100 ms integration time on the LIA and a 500 ms delay after each step. Control of the sweep generator frequency allows for 2D field mapping on and off resonance.

Figure 12D:
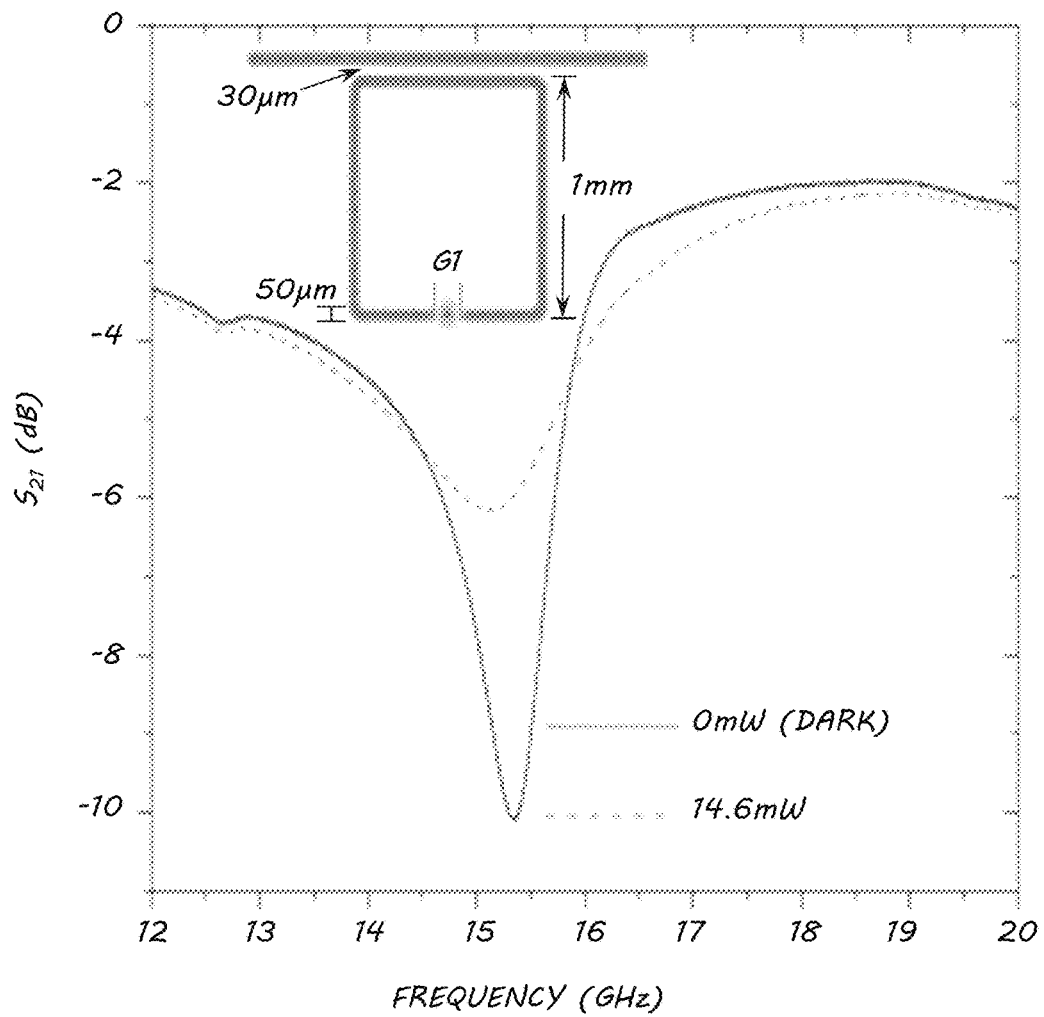
FIG. 12D is a graph showing dark (solid) and illuminated (dashed) RF spectra for resonant circuit excited with 14.6 mW of 785 nm laser light in gap of SRR with inset showing top view of resonant structure and position of laser spot.

FIG. 12D shows a change in the RF spectra of a representative RRFP under illumination at the gap of the SRR structure. The x-axis shows the frequency of operation with a range of 12 to 20 GHz while the y-axis show the $S_{21}$ parameter of RF signal measurement that is an indicator of forward transmitted power in dB with a range of 0 to-11 dB. The 0 mW (DARK) solid curve in FIG. 12D represents no light incident on the gap and the second dashed curve shows data when 14.6 mW laser power absorbed in the gap. The RRFPs related to this illustrated embodiment all utilize semi-insulating (SI) GaAs substrates as the dielectric material. A variety of resonator structures were fabricated using standard UV photolithography, metallization and lift-off techniques. The micros trip lines and ground planes consist of 0.5 µm of Au with a 10 nm Ti layer for adhesion.

Figure 13A:
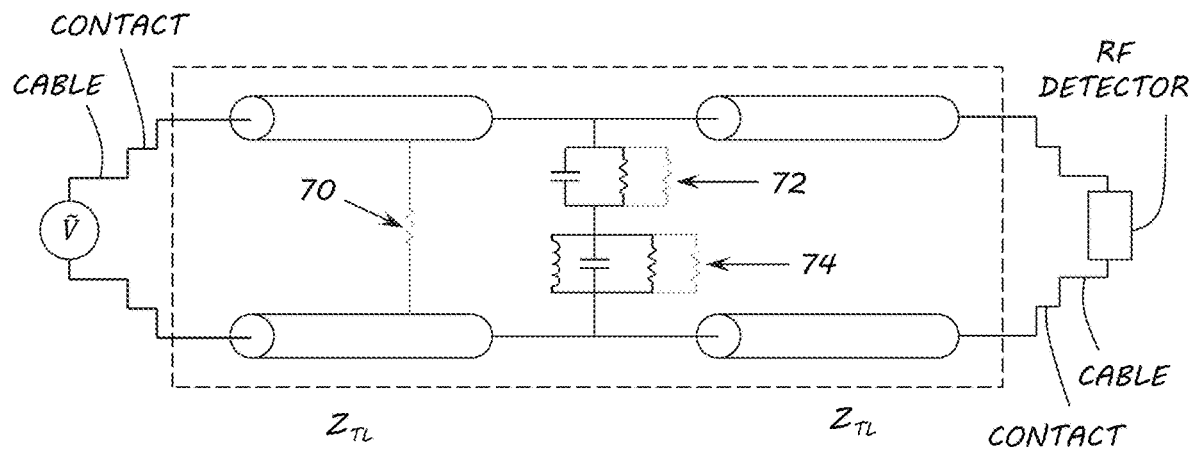
FIG. 13A is a schematic of a transmission line circuit model.

The RF circuits are modeled both analytically, using a straightforward transmission line (TL) model, and numerically, using a commercial finite element model software. The basic circuit modeled is shown in FIG. 13A. It consists of a voltage source connected via a cable and contact to an RLC (resistor-inductor-capacitor) circuit that is terminated with an RF detector connected using a cable and contact. Here the experimental, simulated, and TL-modeled dark RF spectra is shown for a 1 mm SRR with a 40 µm capacitive gap, coupled to a micros trip busline via a 30 µm coupling gap. Both the numerical simulation and TL model show a strong agreement with the dark experimental data, though the numerical simulations show uniformly stronger signal due in part to the omission of the contact pads (input is launched directly onto, and read out directly from, the micros trip TL).

In the numerical model, the effect of incident light upon the device is to alter the local conductivity in the dielectric of the RF circuit. To model this effect, the change in the local conductivity due to the EHP concentration was calculated, determined from the laser power, wavelength, spot size, and absorption depth, as well as the EHP lifetime. A block of this calculated conductivity is then placed into the numerical model (at the location of the laser probe) and the new RF behavior of the altered circuit is modelled. This method for simulating the modulation of the circuit by incident light has been previously demonstrated to agree with experimental $S_{21}$ parameters in dB.

Figure 13B:
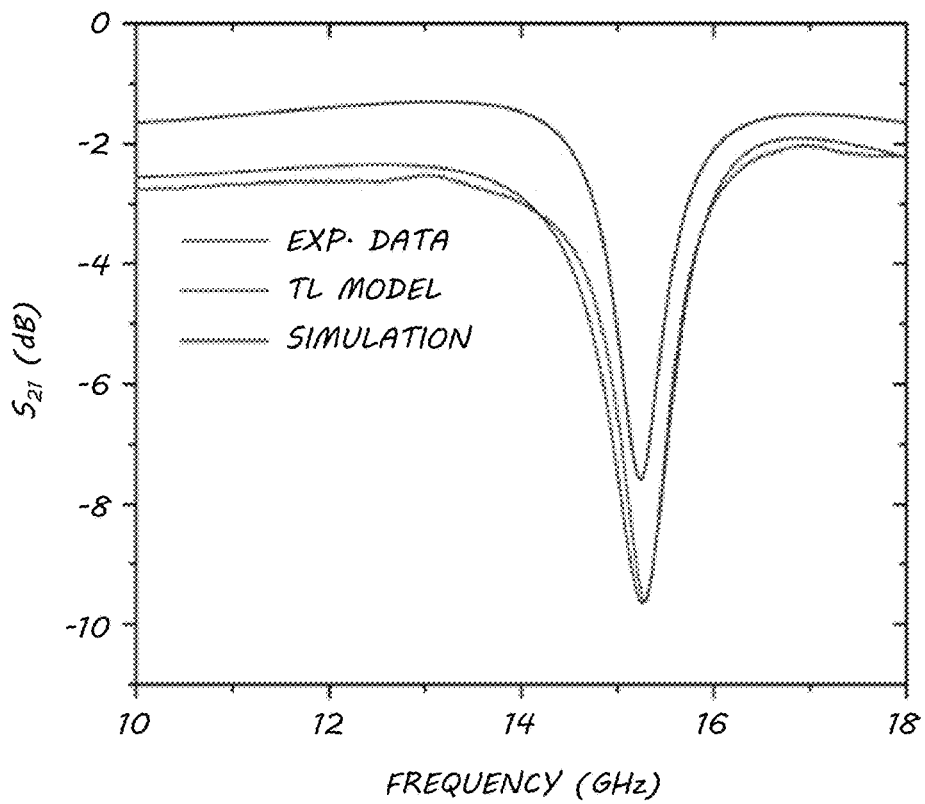
FIG. 13B is a graph illustrating experimental, transmission line circuit model and HFSS-simulated RF spectra for a representative SRR circuit.
Figures 14A, 14B:
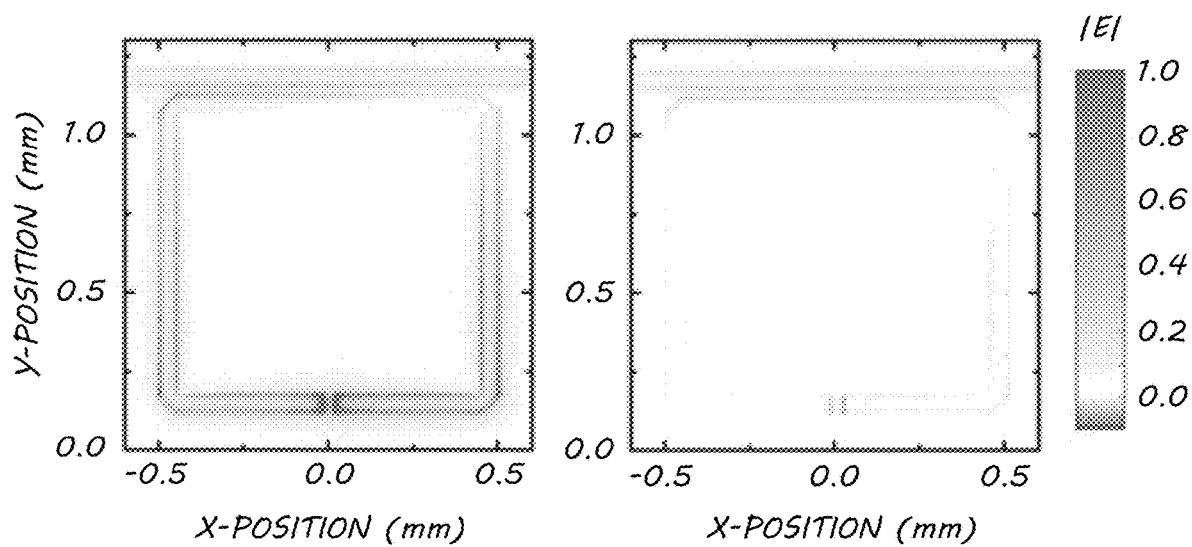
FIGS. 14A-14D include HFSS-simulated (A, B) Electric fields and experimental (C, D) MMOIL contour plots for a square SRR resonator driven (B, D) off and (A, C) on resonance, with simulations performed at (A) $f_{on}$=15.24 GHz and (B) $f_{off}$=10 GHz and experimental data taken at (C) $f_{on}$=15.2 GHz and (D) $f_{off}$=10 GHz.
Figures 14C, 14D:
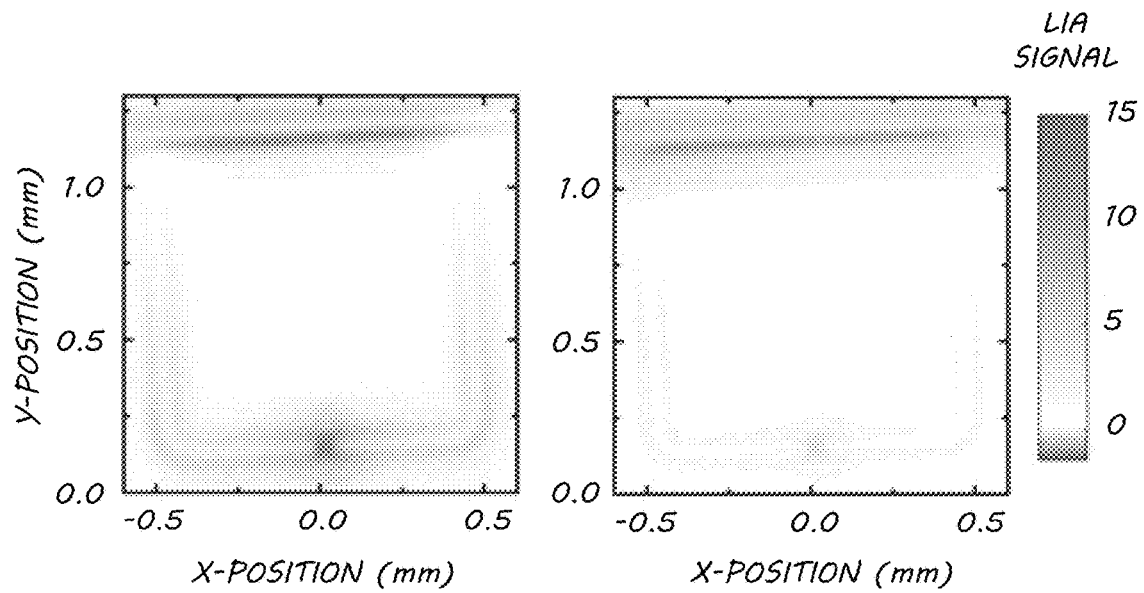

For the transmission line (TL) model, the change in the local conductivity from the incident light is modeled as a shunt conductance (resistor) positioned at the region of the incident light, as shown in FIG. 13A, for light incident upon the bus line (resistor 70), the coupling gap (resistor 72) and the capacitive gap (G1 in FIG. 12D) of the SRR (resistor 74). FIG. 13B shows the experimental, simulated, and TL-modeled dark (no incident light) RF spectra for a 1 mm SRR with a 40 µm capacitive gap, coupled to a micros trip busline via a 30 µm coupling gap or spacing. The numerical simulation and TL model show a strong agreement with the dark experimental data. However, the probe area (beam spot) is much smaller than the physical realization of the lumped elements in the model. Thus, the effect of the probe, incident upon the SRR for example, will vary significantly with the probe's position on the SRR. This can be accounted for by allowing the additional photo-induced conductance in our model to vary as a function of position on the SRR. The magnitude of the shunt conductance used to model the probe at varying positions on the lumped elements thus indicates the strength of the RF field at those positions FIGS. 14A and 14B show the HFSS-simulated field amplitude profile at the surface of the semiconductor substrate on resonance ($f_{on}$) and off resonance ($f_{off}$), respectively, for the SRR resonator whose RF properties are shown in FIG. 13A. The MMOIC data from the same sample, on and off resonance, is shown in FIGS. 14C and 14D. Qualitatively, the basic field profiles observed in the simulations match nicely with the experimental MMOIC data. Comparison of the simulated electric fields of FIGS. 14A and 14B to the experimental lock-in amplifier (LIA) signals of FIGS. 14C and 14D indicate that the experimental data scales approximately as the square of the simulated electric field intensity. Simulations performed at (FIG. 14A) $f_{on}$=15.24 GHz and (FIG. 14B) $f_{off}$=10 GHz show the measured electric field amplitudes normalized to 1 at maximum. Experimental data taken at (FIG. 14C) $f_{on}$=15.2 GHz and (FIG. 14D) $_{off}$=10 GHz show LIA signal amplitude via a hue denoted by a scale bar on the figures with a minima at 0 and maxima at 15. Such a relationship is to be expected, as the signal on the LIA comes from the change in transmitted power, not field, measured by the RF detector.

As can be seen from the data in FIGS. 14A-14D, a significant increase in signal may be observed when the SRR is driven at resonance. The MMOIC signal, on resonance, is seen to be localized primarily in the split gap of the SRR, but also along the corners and edges of the lower arm of the SRR (locations corresponding to strong electric fields, as seen in the simulations). Off resonance, little to no response is seen in the SRR gap, with the majority of the (now negative) signal observed in the coupling gap and along the micros trip busline.

However, the simulations do show differences from the experimental results. First, the model gives unrealistic artifacts (strong fields) at any sharp corners and edges. This effect is well known in finite element methods, and has the effect of skewing the scale of the simulated data, creating an artificially large maximum field near the sharp corners. Secondly, while the HFSS simulations are able to provide the electric field distribution on the micros trip lines, the MMOIC technique cannot measure this field. MMOIC relies on free carrier generation in the dielectric but cannot induce any significant losses or additional conductivity when the laser is incident upon the metal of the micros trip lines. The final and potentially most significant difference between the HFSS simulations and the MMOIC experimental results is the sign of the field profiles. In the experimental results, the change in the power delivered to the load is negative for laser light incident on the busline and coupling region for all frequencies, as well as for light incident upon the SRR off resonance. However, when the circuit is driven at resonance, and optically pumped on the SRR, a positive signal is observed. The HFSS simulations, which show electric field magnitude, will show a positive signal for all frequencies and positions.

The variation of the sign of the experimentally measured signal indicates that a purely linear relationship between experimental signal and RF field strength, across a range of circuit geometries, is not achievable with the current MMOIC technique. For instance, for a bandpass circuit consisting of a microstrip transmission line with a loaded SRR, optically pumping the SRR gap, at resonance, would result in a large, negative change in the transmitted signal, while the capacitively coupled SRR bandstop filter clearly shows a positive signal. However, as detailed below, qualitative understanding of the RF field can be achieved via MMOIC, given the above limitations. First, the MMOIC technique can provide an accurate picture of RF field strength as a function of frequency, for a given location on the circuit. Alternatively, by modeling the optical probe as a variable conductance, for a known circuit geometry and thus a known TL model, we can gain a more accurate understanding of field profile in the circuit under investigation.

Figure 15A:
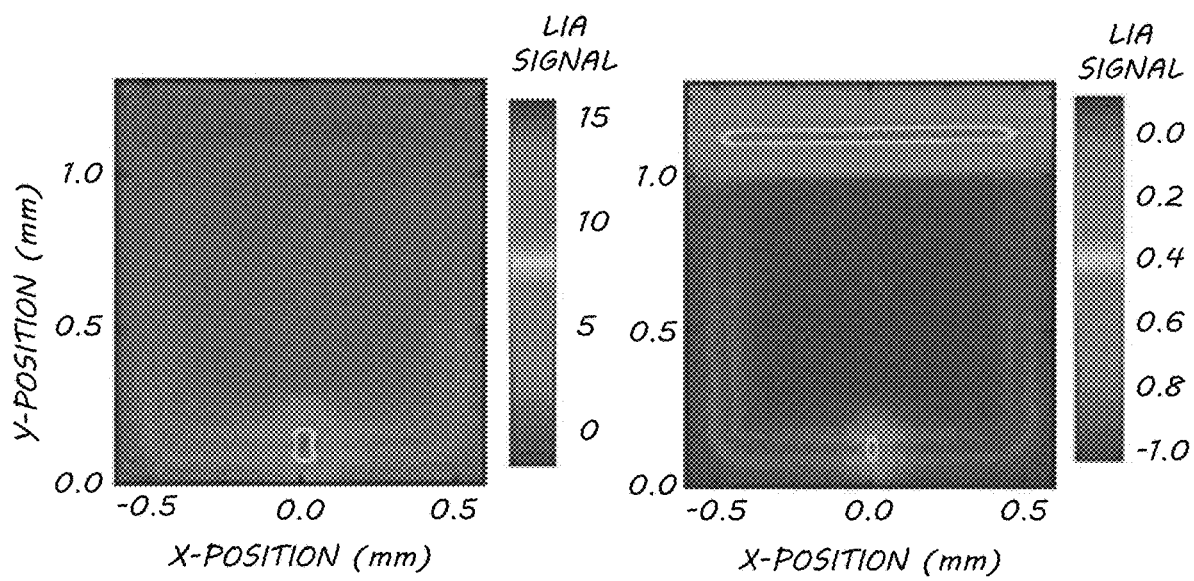
FIGS. 15A-15C include experimental MMOIC plots for different resonator structures (A) 20 μm SRR gap (B) 70 μm SRR gap and (C) circular SRR with 40 μm gap, with top row showing on-resonance scans (A) $f_{on}$=15.76 GHz, (B) $f_{on}$=15.4 GHz, (C) $f_{on}$=17.9 GHz) and bottom row showing off-resonance data ($f_{off}$=10 GHz)
Figure 15B:
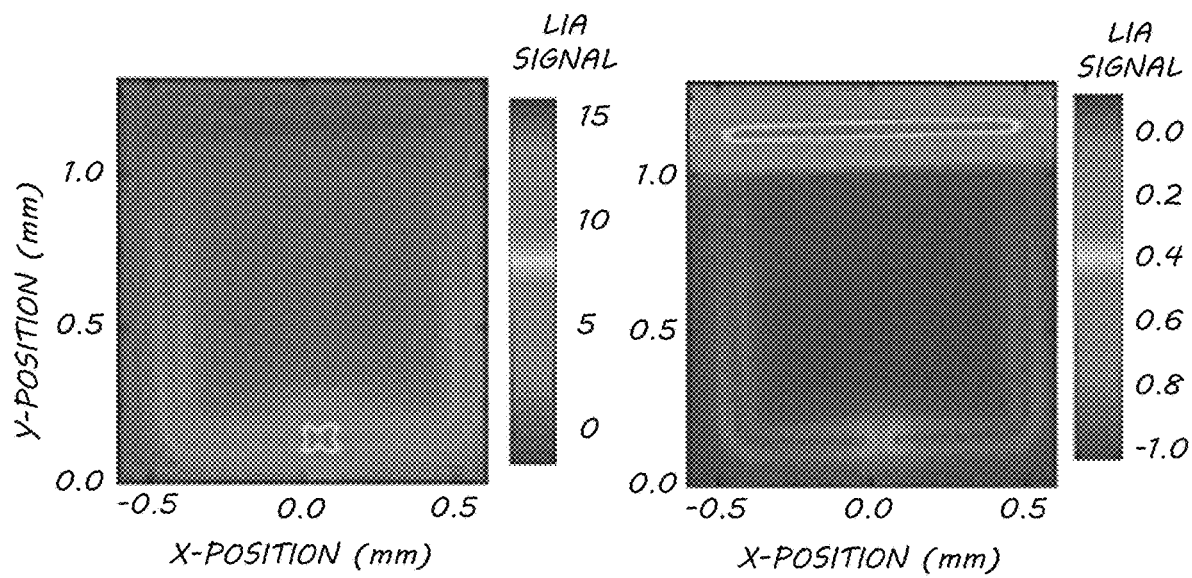
Figure 15C:
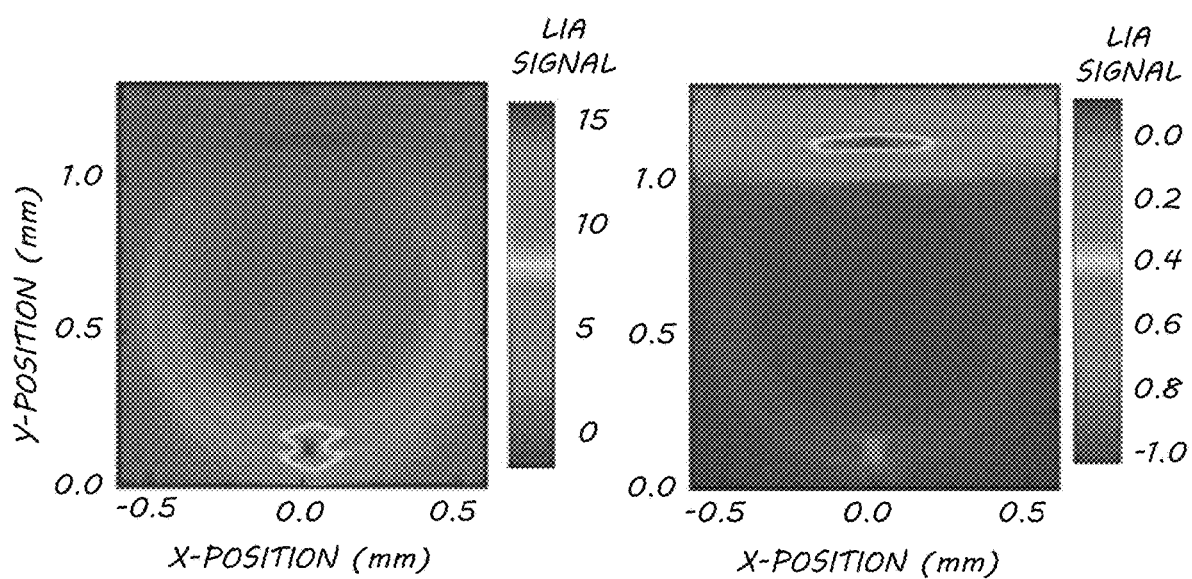

As an example of the former, FIGS. 15A-15C show the experimental MMOIC data on ($f_{on}$=15.76 GHz, 15.4 GHz, 17.9 GHz) and off ($f_{off}$=10 GHz) resonance for square SRRs with (a) 20 μm and (b) 70 μm gap sizes and (c) a circular SRR with 40 μm gap, respectively. FIGS. 15A-15C show LIA signal amplitude via a hue denoted by a scale bar on the figures with a minima at 0 and maxima at 15. The off-resonance scans are scaled to better observe the entirely negative valued (and weak) MMOIC data. From the data, it can be seen that the MMOIC data allows for the comparison of field distribution even in similar structures, showing, for instance, the strong field confinement possible in the smaller gap structures, or the change in the field distribution in the coupling region of the circular gap, when compared to the square gap structures.

Figure 16:
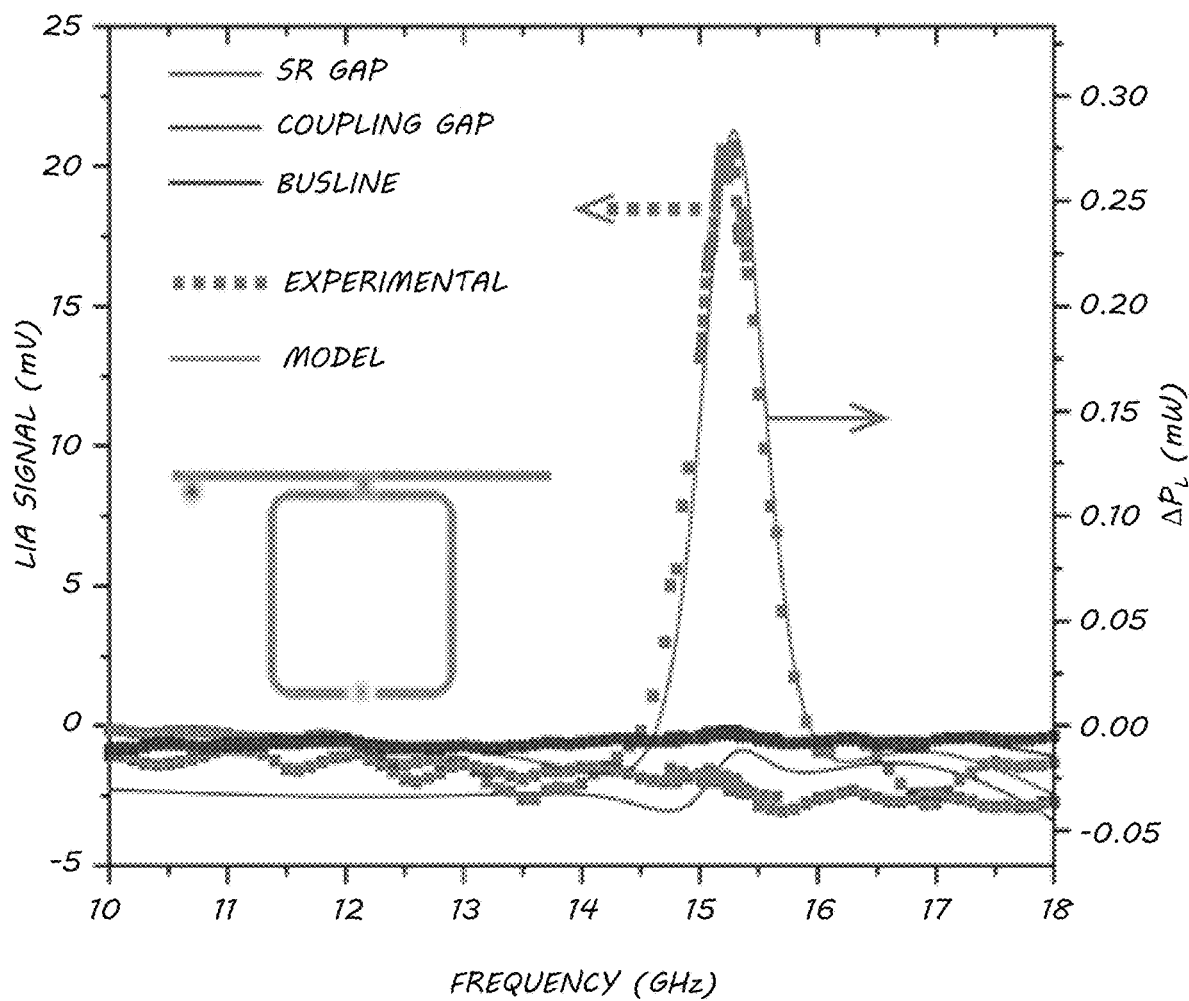
FIG. 16 is a graph illustrating modeled (solid) and experimental (scatter) change in $S_{21}$ as a function of frequency for light incident on busline, coupling gap, and SRR gap.

The structures investigated experimentally are modeled using the TL model with shunted lumped elements shown in FIG. 13A, with the coupling region modeled as a combination of busline and coupling capacitor conductances. The incident light is modelled as a variable conductance in the circuit model, whose position and magnitude depend on the position of the laser probe and strength of the RF field in that region, respectively. This optically induced conductance will alter the complex shunt impedance of the lumped element resonator, thus changing the power dissipated in the resonator, as well as the reflection coefficient of the resonator. Depending on the drive frequency of the circuit, this results in a positive or negative change in the measured power delivered to the load ($\Delta P_{Ld}$). FIG. 16 shows the experimental results (dashed line) and model results (solid line) of our $\Delta P_{Ld}(f)$ measurement for probe light incident upon three different locations of the circuit: along the busline (resistor 70), in the coupling region (resistor 72) and in the SRR gap (resistor 74). The only peak seen in FIG. 16 is obtained when light is incident on the SRR gap whereas in the other two locations, no appreciable change is observed and shown in the curves around ~0 mV LIA signal which has a range of −5 to 25 mV in the figure. The modeled $\Delta P_{Ld}(f)$, with a range of 0 to 0.3 mW indicated by the using the lumped element transmission line model in FIG. 13A is also plotted on the same graph, and shows a strong agreement with the experimental results. A larger conductance is used to fit the experimental SRR gap data, relative to the busline or coupling region data, reflecting the stronger electric field in the gap. Thus, the position of the microscopic optical probe in our MMOIC technique can be modeled as a macroscopic conductance placed in positions of the lumped element model corresponding to the probed region (busline, coupling region, or SRR). The RF field strength associated with the probe position is modeled by control of the magnitude of the inserted conductance, with larger conductances used for areas of highly concentrated fields, such as the SRR gap.

While the illustrated embodiment demonstrates MMOIC probes only the surface of RF circuits fabricated on semiconducting substrates, other embodiments may allow for a greater range of circuitry to be investigated or, alternatively, three-dimensional (3D) probing of fields in RF circuits. For the former, either spin-on or low temperature-deposited photoconductive films could be applied to RF circuits on non-photoconductive substrates, providing a photo-excited source of loss on the circuit surface. Following mapping, the photo-responsive film could be removed without harming the circuit itself, assuming the correct choice of film. For the latter, two-photon absorption (2PA) could be utilized to provide not only smaller excitation volumes, but by control of the focal spot position both laterally and into the circuit dielectric. Such an approach could offer a 3D image of fields inside of the dielectric substrate of an RF circuit.

While SRRs have been used in the illustrated embodiments, there are a number of other resonant structures and semiconductor substrates/structures that may be used in a similar configurations that have different characteristics (such as higher Q etc.) that would provide a designer with a larger design space for specific applications. Further band gap engineered structures such as Quantum Wells may be used as the substrate or placed in favorable areas of the device such as the SRR gap or line resonator's coupling region.

While the present invention has been illustrated by a description of one or more embodiments thereof and while these embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What is claimed is:

1. A resonant circuit comprising:
an active material substrate having a top face;
a busline having a single input and a single output located on the top face of the active material substrate;
a RF resonator geometry located on the top face of the active material substrate in electrical communication with the busline,
wherein application of photon energy to the active material substrate changes the resonance of the RF resonator geometry at room temperatures, and
wherein the RF resonator geometry has a gap, and wherein the photon energy is applied to the gap of the RF resonator geometry, and
wherein the RF resonator geometry comprises split ring resonators (SRRs).

2. The resonant circuit of claim 1, wherein the active material substrate is selected from a group consisting of: semi-insulating (SI) GaAs, high-resistivity (HR) Si, epitaxial GaAs, epitaxial InAs, and combinations thereof.

3. A resonant circuit comprising:
an active material substrate having a top face;
a busline having a single input and a single output located on the top face of the active material substrate;
a first RF resonator geometry tuned to a first frequency, the first RF resonator geometry located on the top face of the active material substrate in electrical communication with the busline; and
a second RF resonator geometry tuned to a second frequency, the second RF resonator geometry located on the top face of the active material substrate in electrical communication with the busline,
wherein application of photon energy to the active material substrate respectively changes the resonance of the first and second RF resonator geometry at room temperatures,
wherein the first RF resonator geometry has a first gap and the second RF resonator geometry has a second gap,
wherein the photon energy is applied to the first and second gap of the first and second RF resonator geometry, respectively, and
wherein the first and second RF resonator geometry comprise split ring resonators (SRRs).

4. The resonant circuit of claim 3, wherein the active material substrate is selected from a group consisting of: semi-insulating (SI) GaAs, high-resistivity (HR) Si, epitaxial GaAs, epitaxial InAs, and combinations thereof.

5. A resonant circuit comprising:
a passive material substrate having a top face;
an active material thin film located on the top face of the passive material substrate;
a busline having a single input and a single output located on the active material thin film;
a RF resonator geometry located on the active material thin film in electrical communication with the busline,
wherein application of photon energy to the active material thin film changes the resonance of the RF resonator geometry at room temperatures.

6. The resonant circuit of claim 5, wherein the RF resonator geometry is a first RF resonator geometry tuned to a first frequency, the resonant circuit further comprising:
a second RF resonator geometry tuned to a second frequency, the second RF resonator geometry located on the active material thin film in electrical communication with the busline;
wherein application of the photon energy to the active material thin film changes the resonance of the second RF resonator geometry at room temperatures.

7. The resonant circuit of claim 6, wherein the second RF resonator geometry has a respective gap, and wherein the photon energy is applied to the respective gap of the second RF resonator geometry.

8. The resonant circuit of claim 7, wherein the RF resonator geometry comprises split ring resonators (SRRs).

9. The resonant circuit of claim 5, wherein the RF resonator geometry has a gap, and wherein the photon energy is applied to the gap of the RF resonator geometry.

10. The resonant circuit of claim 9, wherein the RF resonator geometry comprises split ring resonators (SRRs).

11. The resonant circuit of claim 5, wherein the active material thin film is selected from a group consisting of: semi-insulating (SI) GaAs, high-resistivity (HR) Si, epitaxial GaAs, epitaxial InAs, and combinations thereof.

* * * * *